(12) United States Patent
More et al.

(10) Patent No.: US 11,948,988 B2
(45) Date of Patent: Apr. 2, 2024

(54) SOURCE/DRAIN STRUCTURE FOR SEMICONDUCTOR DEVICE

(71) Applicant: Taiwan Semiconductor Manufacturing Co., Ltd., Hsinchu (TW)

(72) Inventors: Shahaji B. More, Hsinchu (TW); Cheng-Han Lee, New Taipei (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 17/868,462

(22) Filed: Jul. 19, 2022

(65) Prior Publication Data
US 2022/0367649 A1    Nov. 17, 2022

Related U.S. Application Data

(63) Continuation of application No. 16/935,890, filed on Jul. 22, 2020, now Pat. No. 11,469,305.

(51) Int. Cl.
| | |
|---|---|
| *H01L 29/417* | (2006.01) |
| *H01L 21/8234* | (2006.01) |
| *H01L 29/04* | (2006.01) |
| *H01L 29/66* | (2006.01) |
| *H01L 29/78* | (2006.01) |

(52) U.S. Cl.
CPC ......... *H01L 29/41791* (2013.01); *H01L 21/823418* (2013.01); *H01L 21/823431* (2013.01); *H01L 21/823475* (2013.01); *H01L 29/04* (2013.01); *H01L 29/66795* (2013.01); *H01L 29/785* (2013.01)

(58) Field of Classification Search
CPC ......... H01L 29/41791; H01L 29/66795; H01L 29/04; H01L 21/823431; H01L 29/42392; H01L 29/0653; H01L 29/785; H01L 21/823418; H01L 21/823475; H01L 29/7848; H01L 29/7851; H01L 27/0886; H01L 29/0847
See application file for complete search history.

(56) References Cited

U.S. PATENT DOCUMENTS

| | | | |
|---|---|---|---|
| 9,614,086 B1 | 4/2017 | Yeo et al. | |
| 10,170,365 B2 | 1/2019 | Ching et al. | |
| 11,469,305 B2 * | 10/2022 | More | H01L 21/823431 |

(Continued)

OTHER PUBLICATIONS

Extended European Search Report, for European Patent Appl. No. 21186902.9, 6 pages, dated Dec. 3, 2021.

*Primary Examiner* — Changhyun Yi
(74) *Attorney, Agent, or Firm* — Sterne, Kessler, Goldstein & Fox P.L.L.C.

(57) ABSTRACT

The present disclosure describes a semiconductor structure and a method for forming the same. The semiconductor structure can include a substrate, a gate structure over the substrate, and a source/drain (S/D) region adjacent to the gate structure. The S/D region can include first and second side surfaces separated from each other. The S/D region can further include top and bottom surfaces between the first and second side surfaces. A first separation between the top and bottom surfaces can be greater than a second separation between the first and second side surfaces.

20 Claims, 16 Drawing Sheets

(56) References Cited

U.S. PATENT DOCUMENTS

| | | | |
|---|---|---|---|
| 2003/0013305 A1* | 1/2003 | Sugii | H01L 21/0245 |
| | | | 257/E21.32 |
| 2015/0303118 A1* | 10/2015 | Wang | H01L 29/7853 |
| | | | 257/401 |
| 2018/0019339 A1* | 1/2018 | Colinge | H01L 29/66636 |
| 2018/0151737 A1 | 5/2018 | Yang et al. | |
| 2018/0190810 A1 | 7/2018 | Li et al. | |
| 2018/0254348 A1 | 9/2018 | Ching et al. | |
| 2019/0164835 A1 | 5/2019 | Lu et al. | |
| 2019/0165175 A1* | 5/2019 | More | H01L 29/785 |
| 2020/0176565 A1 | 6/2020 | Ting et al. | |
| 2020/0395445 A1* | 12/2020 | Choi | H01L 29/1079 |
| 2022/0028991 A1 | 1/2022 | More et al. | |

\* cited by examiner

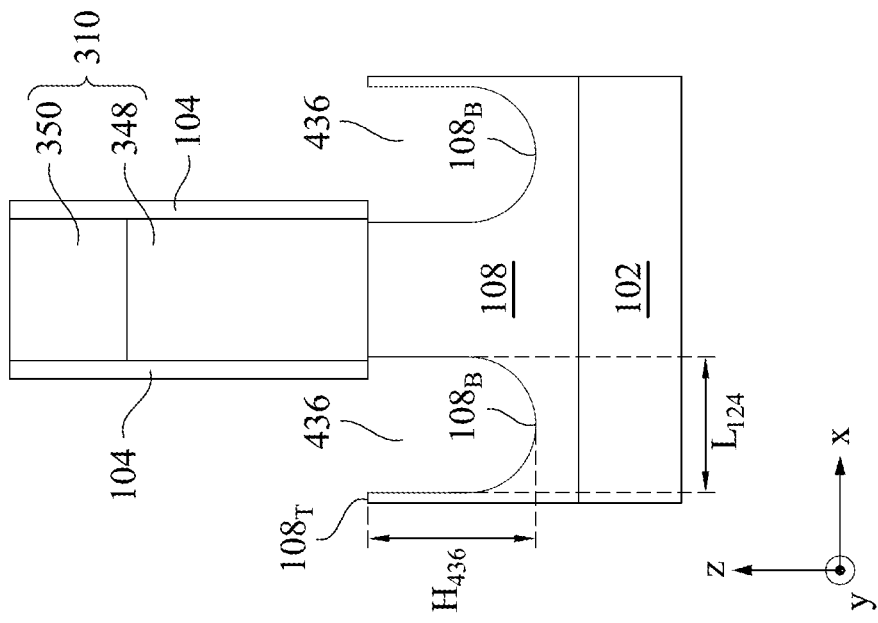
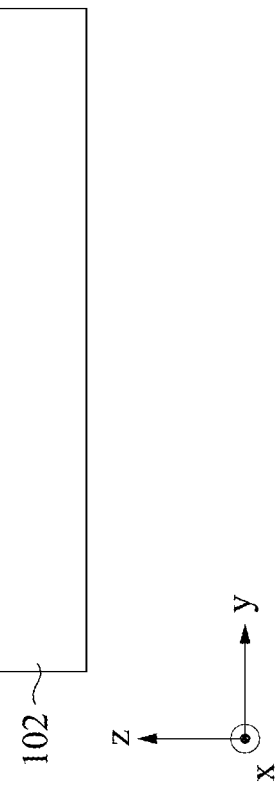
Fig. 4A
Fig. 4B

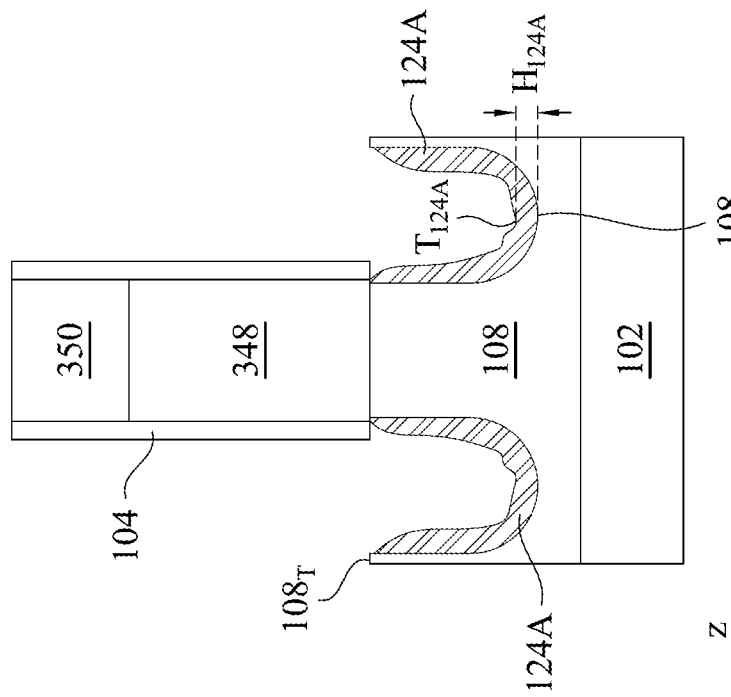
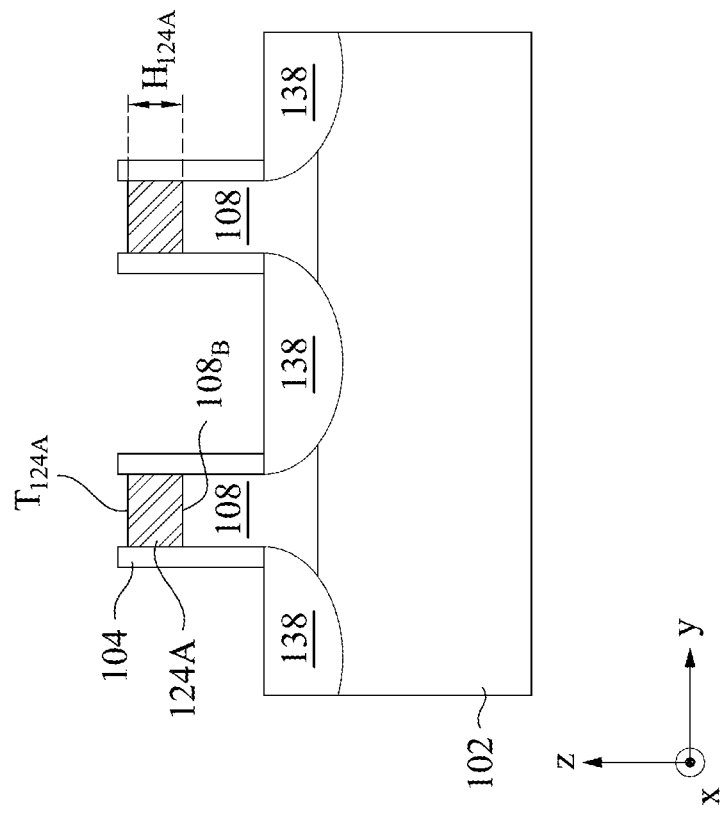
Fig. 5A
Fig. 5B

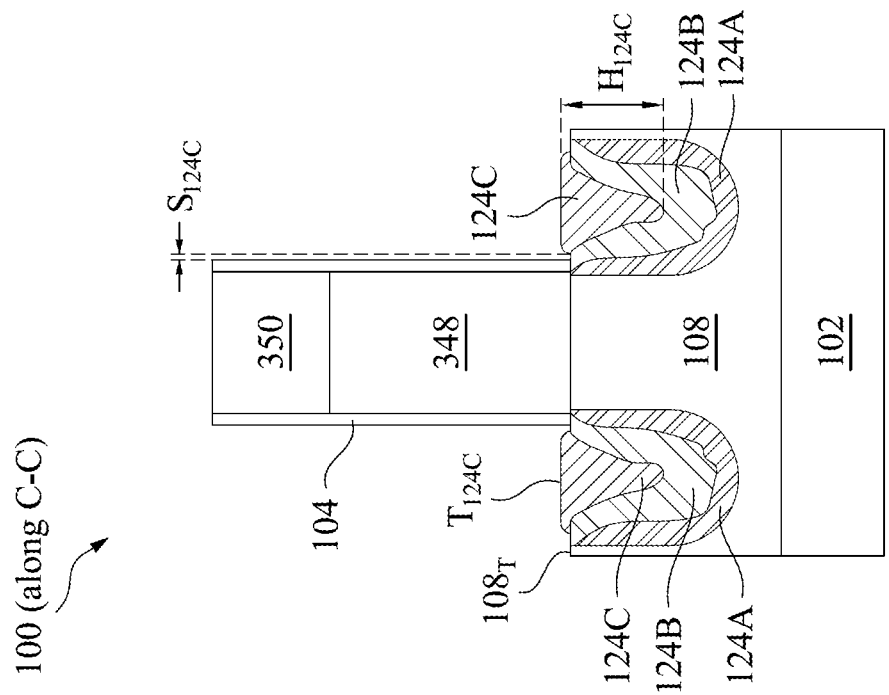
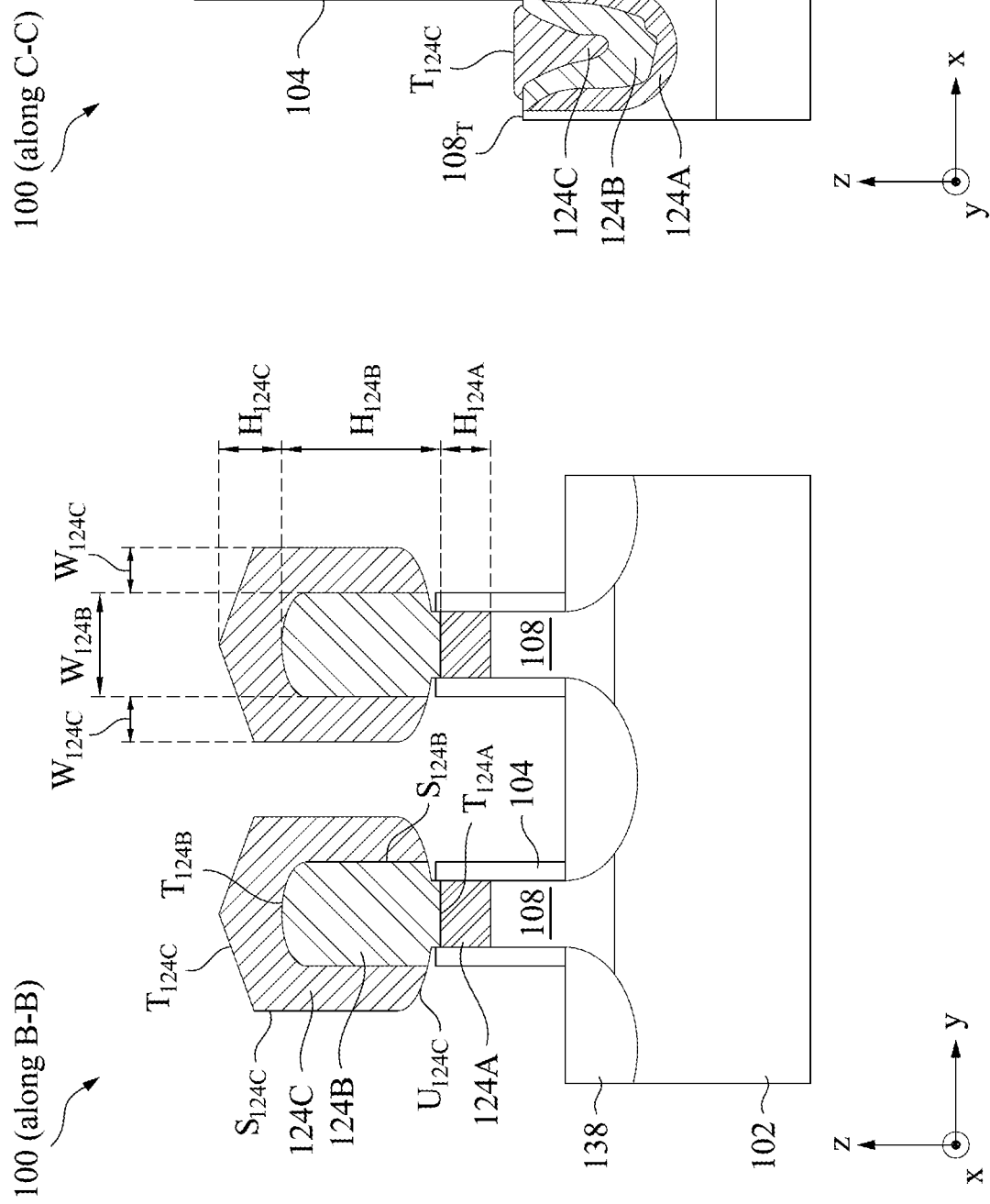
Fig. 7B
Fig. 7A

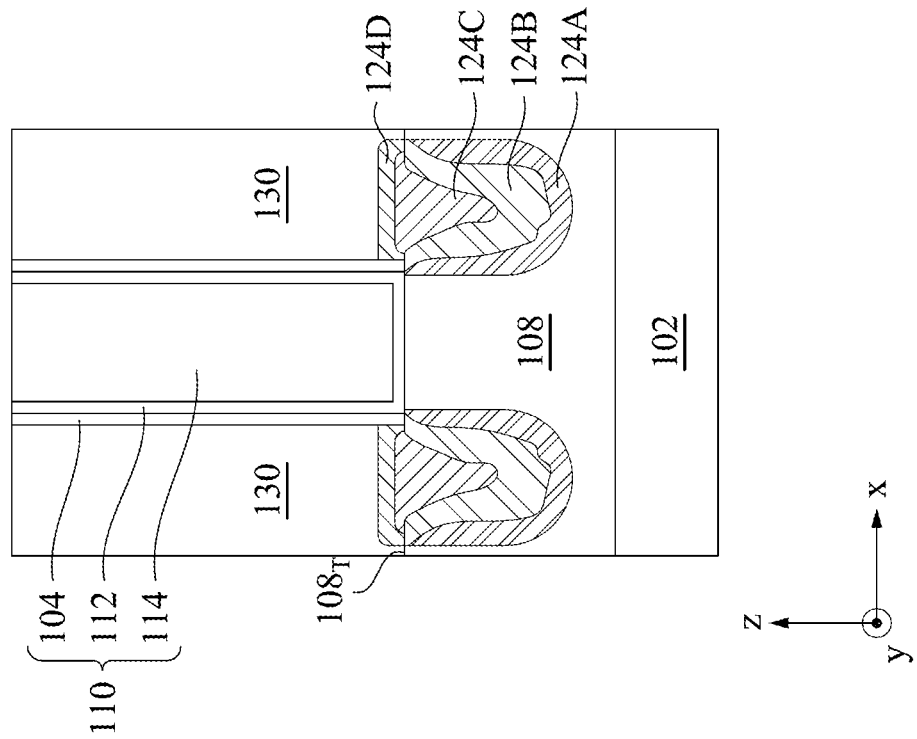
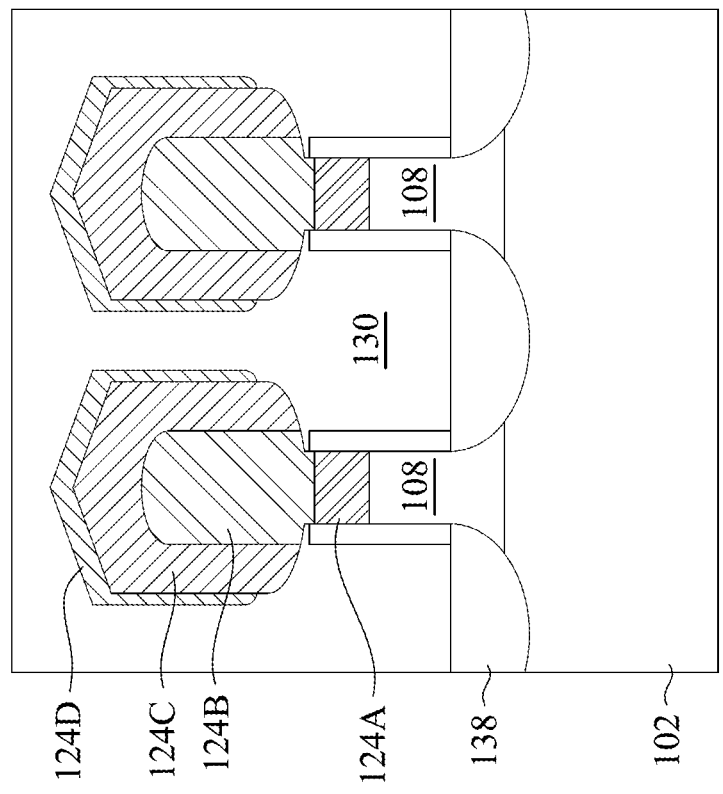
Fig. 10B
Fig. 10A

SOURCE/DRAIN STRUCTURE FOR SEMICONDUCTOR DEVICE

CROSS-REFERENCE TO RELATED APPLICATION

This application is a continuation of U.S. Non-provisional patent application Ser. No. 16/935,890, titled "Source/Drain Structure for Semiconductor Device," filed on Jul. 22, 2020, which is incorporated by reference herein in its entirety.

BACKGROUND

Advances in semiconductor technology has increased the demand for transistors with higher performance for faster processing systems. To meet this demand, it is important to reduce the transistor's contact resistance to minimize transistor delay (e.g., RC delay). Reducing the transistor's contact resistance in its source/drain terminals can increase transistor speed.

BRIEF DESCRIPTION OF THE DRAWINGS

Aspects of this disclosure are best understood from the following detailed description when read with the accompanying figures.

FIGS. 3A-8A and 3B-8B are cross-sectional views of a semiconductor device at various stages of its fabrication process, according to some embodiments.

FIGS. 10A-11A, 10B-11B, and 12 are cross-sectional views of a semiconductor device at various stages of its fabrication process, according to some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
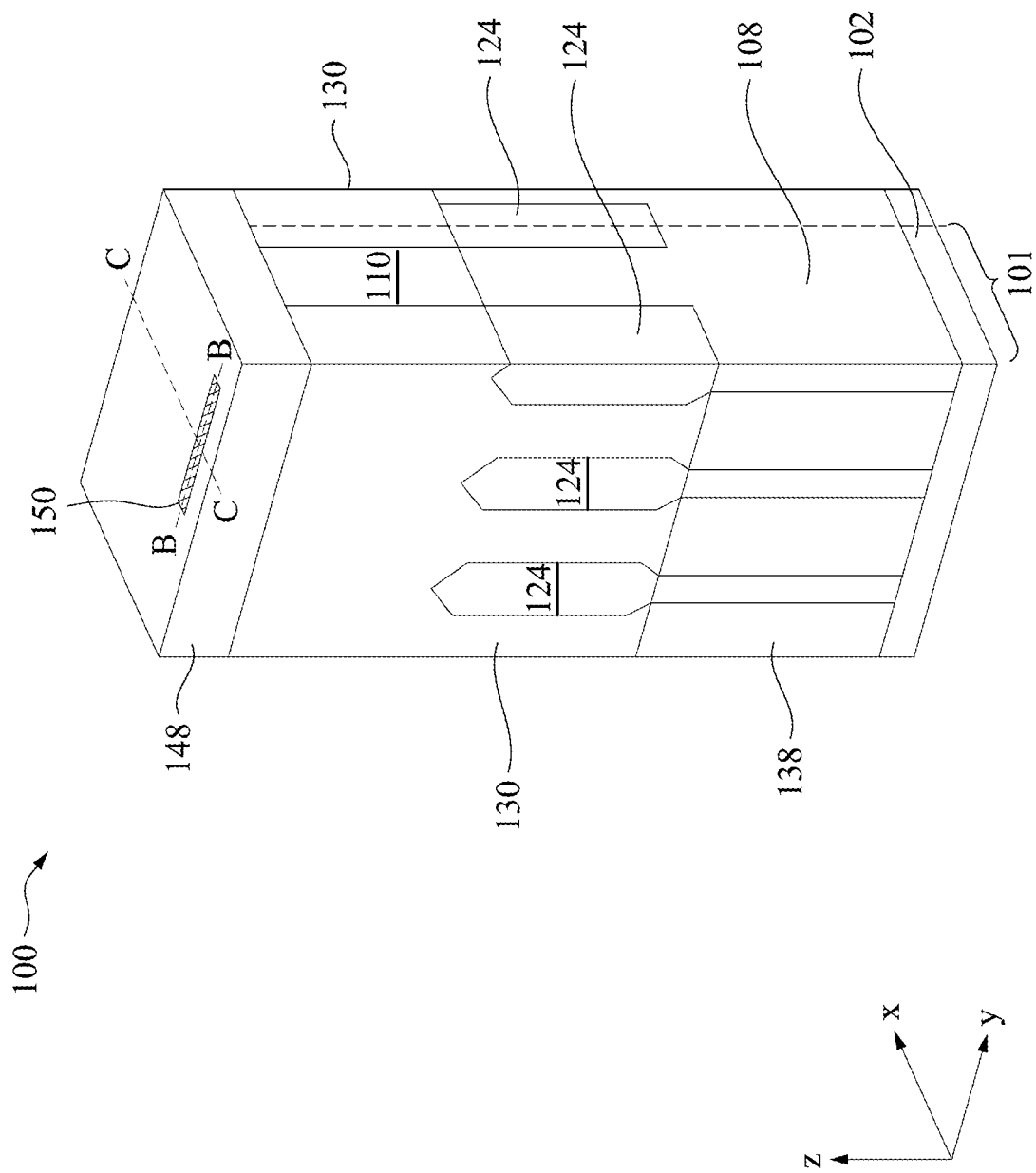
FIG. 1A is an isometric view of a semiconductor device, according to some embodiments.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5%/10%/15%/20%/etc of the value. These values are merely examples and are not intended to be limiting. The terms "about" and "substantially" can refer to a percentage of the values as interpreted by those skilled in relevant art(s) in light of the teachings herein.

As used herein, the term "vertical" means nominally perpendicular to the surface of a substrate.

Fins associated with fin field effect transistors (finFETs) or gate-all-around (GAA) FETs can be patterned by any suitable method. For example, the fins can be patterned using one or more photolithography processes, including a double-patterning process or a multi-patterning process. Double-patterning and multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers can then be used to pattern the fins.

Technology advances in the semiconductor industry drive the pursuit of integrated circuits (ICs) having higher performance for high-speed applications. In the course of the IC evolution, raised transistor source/drain (RSD) structures have been adopted to reduce contact resistance and enhance channel stress to improve transistor speed. However, the RSD structure can be susceptible to volume loss ("RSD loss") during the fabrication process of the transistor's contact structures. The RSD loss can reduce the transistor's channel stress, thus degrading the transistor's performance. In addition, with reduced transistor pitches in the IC, the RSD structures of adjacent transistors can be merged ("RSD merging"). The RSD merging can cause electrical leakage current between the adjacent transistors, thus causing IC failure.

The present disclosure is directed to a fabrication method and a transistor with a source/drain (S/D) structure that has a reduced lateral extension. Because the reduced lateral extension can decrease the area bombarded by a dry etch plasma process, the S/D structure with the reduced lateral extension can reduce the RSD loss during the fabrication of the transistor's metal contact. In addition, the S/D structure with the reduced lateral extension can also avoid RSD merging between the adjacent transistors. The S/D structure with the reduced lateral extension can further have an enhanced vertical extension. For example, the S/D structure's height can be greater than the S/D structure's width. Because of the enhanced vertical extension, the S/D structure can have sufficient volume to provide sufficient channel stress to improve transistor speed. A benefit of the present disclosure, among others, is to avoid the RSD loss and RSD merging associated with the S/D structure, thus improving the transistor's operating speed and yield.

Figure 1B:
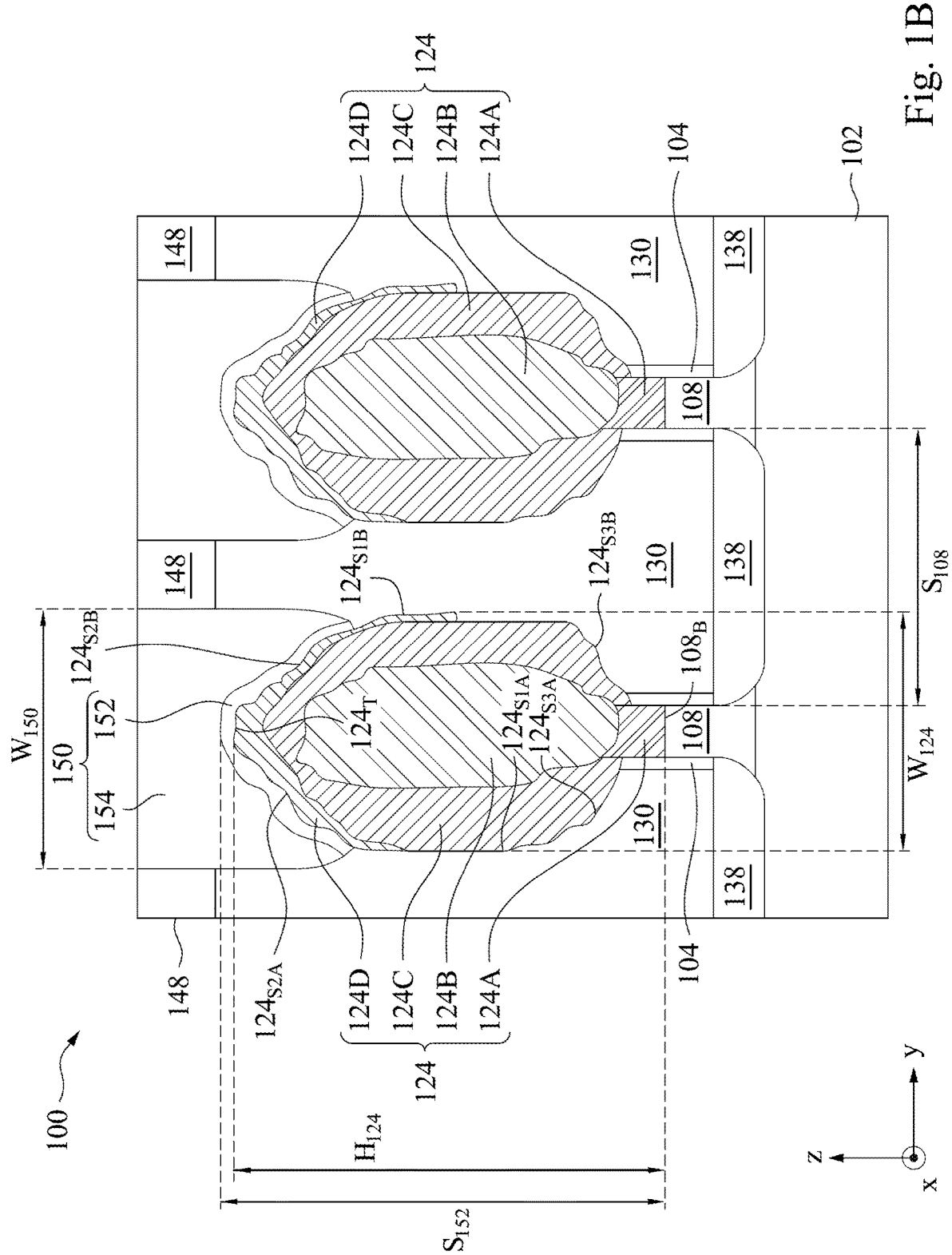
FIGS. 1B and 1C are cross-sectional views of a semiconductor device, according to some embodiments.
Figure 1C:
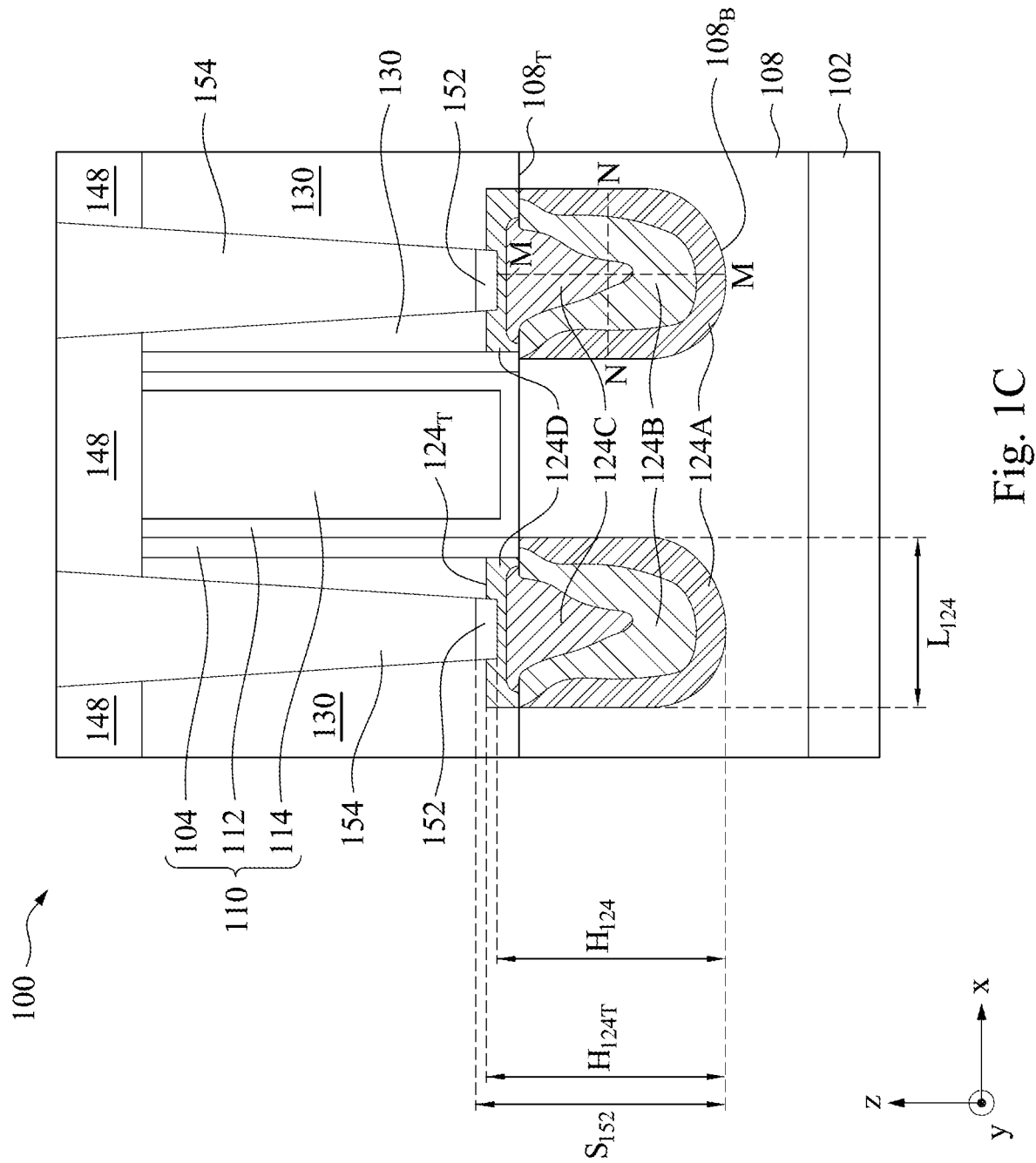
Figure 1D:
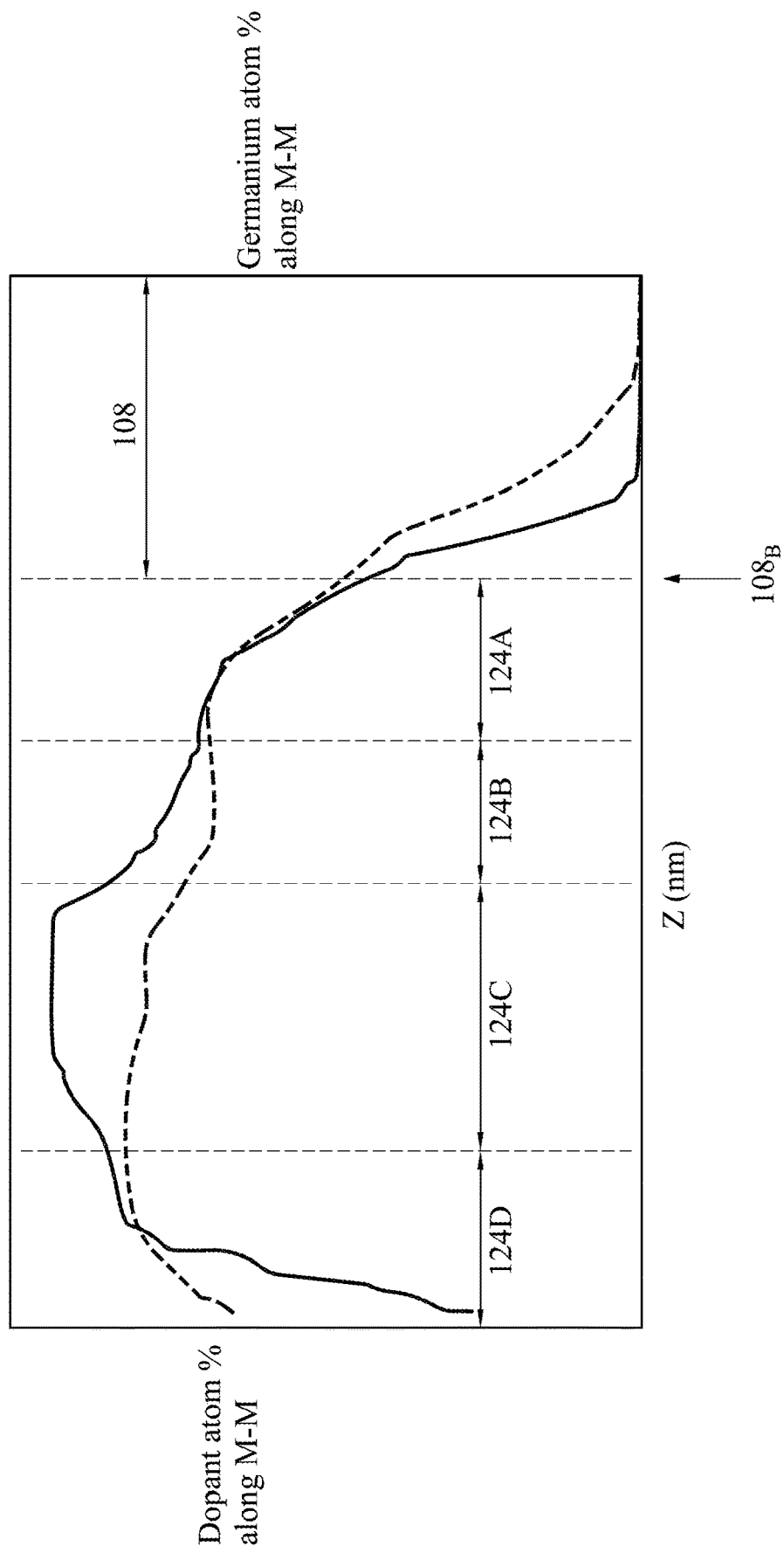
FIG. 1D illustrates atomic concentration profiles of dopants and a semiconductor material of a semiconductor device, according to some embodiments.
Figure 1E:
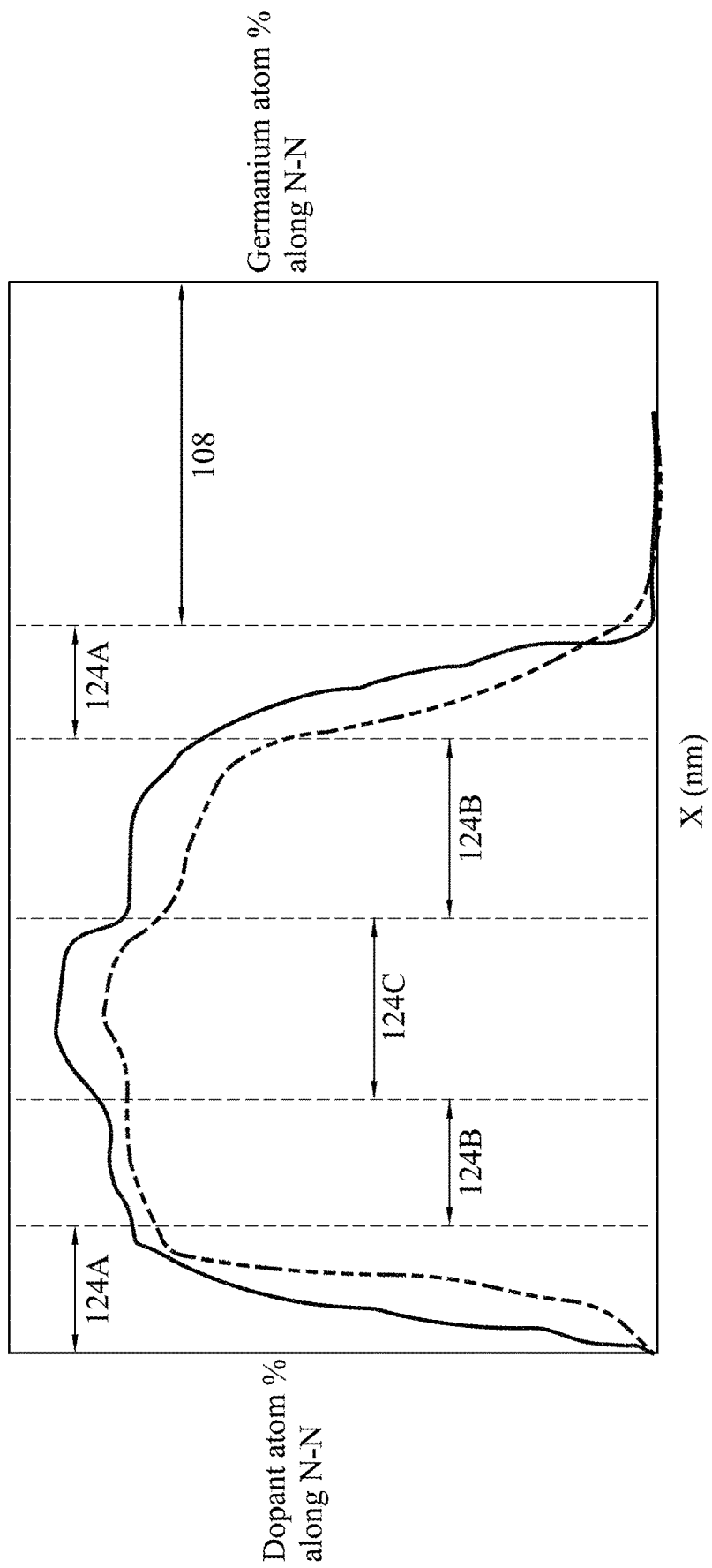
FIG. 1E illustrates atomic concentration profiles of dopants and a semiconductor material of a semiconductor device, according to some embodiments.

A semiconductor device 100 having FET 101 formed over a substrate 102 is described with reference to FIGS. 1A-1E, according to some embodiments. FIG. 1A illustrates an isometric view of semiconductor device 100, according to some embodiments. FIG. 1B illustrates a cross-sectional view along a source/drain (S/D) region (e.g., line B-B of FIG. 1A) of semiconductor device 100, according to some embodiments. FIG. 1C illustrates a cross-sectional view along a channel direction (e.g., line C-C of FIG. 1A) of semiconductor device 100, according to some embodiments. FIGS. 1D and 1E respectively illustrate atomic concentrations of dopants and a semiconductor material (e.g., germanium) along the S/D region (e.g., line B-B of FIG. 1A) and along the channel direction (e.g., line C-C of FIG. 1A) of semiconductor device 100, according to some embodiments. The discussion of elements in FIGS. 1A-1E with the same annotations applies to each other, unless mentioned otherwise. Semiconductor device 100 can be included in a microprocessor, memory cell, or other integrated circuit (IC). Also, even though FET 101 shown in FIGS. 1A-1C is a fin field effect transistor (finFET), FET 101 can be a gate-all-around (GAA) FET, according to some embodiments.

Referring to FIG. 1A, substrate 102 can be a semiconductor material, such as silicon. In some embodiments, substrate 102 can include a crystalline silicon substrate (e.g., wafer). In some embodiments, substrate 102 can include (i) an elementary semiconductor, such as silicon (Si) or germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium carbide (SiGeC), silicon germanium (SiGe), gallium arsenic phosphide (GaAsP), gallium indium phosphide (InGaP), gallium indium arsenide (InGaAs), gallium indium arsenic phosphide (InGaAsP), aluminum indium arsenide (InAlAs), and/or aluminum gallium arsenide (AlGaAs); or (iv) a combination thereof. Further, substrate 102 can be doped depending on design requirements (e.g., p-type substrate or n-type substrate). In some embodiments, substrate 102 can be doped with p-type dopants (e.g., boron (B), indium (In), aluminum (Al), or gallium (Ga)) or n-type dopants (e.g., phosphorus (P) or arsenic (As)).

FET 101 can include a fin structure 108 extending along an x-direction, a gate structure 110 traversing through fin structure 108 along a y-direction, and S/D regions 124 formed over portions of fin structure 108. Although FIG. 1A shows fin structure 108 accommodating one FET 101, any number of FETs 101 can be disposed along fin structure 108. In some embodiments, FET 101 can include multiple fin structures 108 extending along a first horizontal direction (e.g., in the x-direction) and gate structure 110 traversing through the multiple fin structures 108 along a second horizontal direction (e.g., in the y-direction).

Fin structure 108 can be formed over substrate 102 and can include a material similar to substrate 102. In some embodiments, fin structure 108 can include a material (e.g., silicon germanium) having a lattice constant substantially equal to (e.g., lattice mismatch within 5%) that of substrate 102. In some embodiments, fin structure 108 can include a material (e.g., silicon) identical to substrate 102. In some embodiments, fin structure 108 can include multiple channel layers under gate structure 110, each made of identical or different materials from each other. Fin structure 108 can be p-type doped, n-type doped, or un-doped. In some embodiments, a portion of fin structure 108 wrapped by gate structure 110 and another portion of fin structure 108 adjacent to gate structure 110 can be doped differently.

Semiconductor device 100 can further include shallow trench isolation (STI) regions 138 configured to provide electrical isolation between fin structures 108. Also, STI regions 138 can provide electrical isolation between FET 101 and neighboring active and passive elements (not shown in FIG. 1A) integrated with or deposited on substrate 102. STI regions 138 can include one or more layers of dielectric material, such as a nitride layer, an oxide layer disposed on the nitride layer, and an insulating layer disposed on the nitride layer. In some embodiments, the insulating layer can include silicon oxide, silicon nitride, silicon oxynitride, fluorine-doped silicate glass (FSG), a low-k dielectric material, and/or other suitable insulating materials. Based on the disclosure herein, other dielectric materials for STI region 138 are within the scope and spirit of this disclosure.

Referring to FIGS. 1A and 1C, gate structure 110 can be multi-layered structures that wraps around portions of fin structure 108 to modulate FET 101. In some embodiments, gate structure 110 can be a gate-all-around (GAA) structure, where FET 101 can be a GAA FET 101. Gate structure 110 can include a gate dielectric layer 112, a gate electrode 114 disposed on dielectric layer 112, and gate spacers 104 disposed on sidewalls of dielectric layer 112.

Gate dielectric layer 112 can be wrapped around portions of fin structure 108 and can be further disposed between gate electrode 114 and S/D regions 124 to prevent an electrical short in between. Gate dielectric layer 112 can include any suitable dielectric material with any suitable thickness that can provide channel modulation for FET 101. In some embodiments, gate dielectric layer 112 can include silicon oxide and a high-k dielectric material (e.g., hafnium oxide or aluminum oxide), and gate dielectric layer 112 can have a thickness ranging from about 1 nm to about 5 nm. Based on the disclosure herein, other materials and thicknesses for gate dielectric layer 112 are within the scope and spirit of this disclosure.

Gate electrode 114 can function as a gate terminal for FET 101. Gate electrode 114 can include a metal stack wrapping around portions of fin structure 108. Gate electrode 114 can include any suitable conductive material that provides a suitable work function to modulate FET 101. In some embodiments, gate electrode 114 can include titanium nitride, tantalum nitride, tungsten nitride, titanium, aluminum, tungsten, tantalum, copper, or nickel (Ni). Based on the disclosure herein, other materials for gate electrode 114 are within the scope and spirit of this disclosure.

Gate spacer 104 can be in physical contact with gate electrode 114 and/or gate dielectric layers 112. In some embodiments, gate spacer 104 can be formed over fin structure 108's side surfaces. Gate spacer 104 can have a low-k material with a dielectric constant less than about 3.9.

For example, gate spacer 104 can include insulating material, such as silicon oxide, silicon nitride, a low-k material, and a combination thereof. In some embodiments, gate spacer 104 can have a thickness ranging from about 2 nm to about 10 nm. Based on the disclosure herein, other materials and thicknesses for gate spacer 104 are within the scope and spirit of this disclosure.

Referring to FIGS. 1A-1C, FET 101 can have S/D regions 124 formed over fin structure 108 and over opposite sides (e.g., along x-direction) of gate structure 110. Each S/D region 124 can include an epitaxially-grown semiconductor material. In some embodiments, the epitaxially-grown semiconductor material can be the same material as the material of substrate 102. In some embodiments, the epitaxially-grown semiconductor material can have a lattice constant substantially equal to (e.g., lattice mismatch within 5%) that of the material of substrate 102. In some embodiments, the epitaxially-grown semiconductor material can include (i) an elemental semiconductor material, such as Ge and Si; (ii) a compound semiconductor material, such as GaAs and AlGaAs; or (iii) a semiconductor alloy, such as SiGe and GaAsP. The epitaxially-grown semiconductor material of S/D region 124 can be doped with p-type dopants, n-type dopants, or intrinsic dopants. In some embodiments, the p-type dopants can include boron, indium, aluminum, gallium, zinc, beryllium, or magnesium. In some embodiments, the n-type dopants can include phosphorus, arsenic, sulfur, or selenium. In some embodiments, the intrinsic dopants can include iron or chromium. In some embodiments, semiconductor device 100's S/D regions 124 can have different materials and/or doping types from each other.

S/D region 124 can be a bar-shape structure that extends along a vertical direction substantially perpendicular to substrate 102 and shrinks along a lateral direction substantially perpendicular to fin structure 108. For example, S/D region 124 can have a reduced lateral dimension (e.g., width in the y-direction) to avoid or reduce the RSD loss during the fabrication process of trench conductor structure 150 (discussed below at method 200). Further, S/D region 124 can have an enhanced vertical dimension (e.g., height in the z-direction) to enlarge S/D region 124's volume to provide sufficient stress to enhance FET 101's channel mobility. In some embodiments, as shown in FIG. 1B, S/D region 124's height $H_{124}$ can be greater than S/D region 124's width $W_{124}$ to avoid the RSD loss and provide sufficient stress to enhance FET 101's channel. Height $H_{124}$ can be a vertical (e.g., in the z-direction) separation between S/D region 124's top surface $124_T$ and S/D region 124's bottom surface. In some embodiments, height $H_{124}$ can be a vertical (e.g., in the z-direction) separation between the proximity of top surface $124_T$'s topmost vertex and the proximity of S/D region 124's bottommost vertex. In some embodiments, the term "proximity" can refer to an area within a distance of about 1 nm, about 5 nm, about 10 nm, about 20 nm, about 50 nm, or about 100 nm of a target point. In some embodiments, top surface $124_T$'s topmost vertex can be in contact with silicide layer 152 (discussed below). Width $W_{124}$ can be a lateral (e.g., in the y-direction) separation between S/D region 124's two opposite side surfaces $124_{S1A}$ and $124_{S1B}$. In some embodiments, width $W_{124}$ can be a lateral (e.g., in the y-direction) separation between the proximity of side surface $124_{S1A}$'s outermost vertex and the proximity of side surface $124_{S1B}$'s outermost vertex. In some embodiments, a ratio of height $H_{124}$ to width $W_{124}$ can be greater than about 1.0, greater than about 1.5, greater than about 2.0, greater than about 3.0, or greater than about 5.0. If the ratio of height $H_{124}$ to width $W_{124}$ is below the above-noted lower limits, S/D region 124 may be susceptible to RSD loss and/or may not provide sufficient stress to drive FET 101's channel.

Further, S/D region 124 with the reduced lateral dimension (e.g., width in the y-direction) and the enhanced vertical dimension (e.g., height in the z-direction) can avoid the RSD merging between two adjacent fin structures 108 with a tight spacing. For example, as shown in FIG. 1B, two adjacent S/D regions 124 with the reduced lateral dimension and the enhanced vertical dimension can be separated from each other, where the respective two underlying fin structures 108 can be separated from each other with a lateral (e.g., in the y-direction) separation $S_{108}$ from about 10 nm to about 120 nm, from about 20 nm to about 100 nm, or from about 30 nm to about 80 nm. If separation $S_{108}$ is greater than the above-noted upper limits, semiconductor device 100 may not meet the fin pitch requirement determined by the respective technology node (e.g., fin pitch may be required to be less than about 60 nm for a 22 nm technology node), thus failing the product requirement of the IC. If separation $S_{108}$ is less than the above-noted lower limits, semiconductor device 100 may have unintentionally merged fin structures 108 due to the limit of the lithography capability. In some embodiments, two adjacent S/D regions 124 can be separated from each other, where (i) a first ratio of width $W_{124}$ to separation $S_{108}$ can be from about 0.1 to about 2.0, from about 0.2 to about 1.0, or from about 0.3 to about 0.8, and (ii) a second ratio of height $H_{124}$ to width $W_{124}$ can be greater than about 1.0, greater than about 1.5, greater than about 2.0, greater than about 3.0, or greater than about 5.0. If the first ratio of width $W_{124}$ to separation $S_{108}$ is beyond the above-noted upper limits, ILD layer 130 (discussed below) may not be filled between the two laterally adjacent S/D regions 124 If the first ratio of width $W_{124}$ to separation $S_{108}$ is below the above-noted lower limits, semiconductor device 100 may not meet the fin pitch requirement determined by the respective technology node (e.g., fin pitch may be required to be less than about 60 nm for a 22 nm technology node), thus failing the product requirement of the IC. If the second ratio of height $H_{124}$ to width $W_{124}$ is below the above-noted lower limits, S/D region 124 may not provide sufficient stress to drive FET 101's channel. In some embodiments, two adjacent S/D regions 124 can be separated from each other, where (i) a third ratio of width $W_{124}$ to separation $S_{108}$ can be less than about 2.0, less than about 1.0, or less than about 0.8, and (ii) a fourth ratio of height $H_{124}$ to separation $S_{108}$ can be greater than about 0.8, greater than about 1.0, or greater than about 1.5. If the third ratio of width $W_{124}$ to separation $S_{108}$ is beyond the above-noted upper limits, ILD layer 130 (discussed below) may not be filled between the two laterally adjacent S/D regions 124. If the fourth ratio of height $H_{124}$ to separation $S_{108}$ is below the above-noted lower limits, S/D region 124 may not provide sufficient stress to drive FET 101's channel.

In some embodiments, referring to FIG. 1C, portions of S/D region 124's top surface $124_T$ can be in contact with ILD layer 130 (discussed below) and separate from S/D region 124's bottom surface with a height $H_{124T}$, where a ratio of height $H_{124T}$ to width $W_{124}$ can be greater than about 1.0, greater than about 1.5, greater than about 2.0, greater than about 3.0, or greater than about 5.0. If the ratio of height $H_{124T}$ to width $W_{124}$ is below the above-noted lower limits, S/D region 124 may be susceptible to RSD loss and/or may not provide sufficient stress to drive FET 101's channel. In some embodiments, S/D region 124 can extend along a horizontal direction (e.g., in the x-direction) parallel to fin structure 108 with a length $L_{124}$, where a ratio of length $L_{124}$ to width $W_{124}$ (shown in FIG. 1B) can be from about 0.05 to about 1.5, from about 0.1 to about 1.0, or from about 0.2 to about 1.0. If the ratio of $L_{124}$ to width $W_{124}$ is below the above-noted lower limits, ILD layer 130 (discussed below) may not be filled between the two laterally adjacent S/D regions 124. If the ratio of $L_{124}$ to width $W_{124}$ is beyond the above-noted upper limits, semiconductor device 100 may not meet the fin pitch requirement determined by the respective technology node (e.g., fin pitch may be required being less than about 60 nm for the technology node of 22 nm), thus failing the product requirement of the IC.

Referring to FIGS. 1B-1E, S/D region 124 can be a layer stack of epitaxially-grown semiconductor material. For example, S/D region can include a first layer 124A formed in fin structure 108. First layer 124A can extend from fin structure 108's first top surface $108_T$ (shown in FIG. 1C) towards fin structure 108's second top surface $108_B$, where first top surface $108_T$ can be higher than second top surface $108_B$. In some embodiments, first top surface $108_T$ and/or second top surface $108_E$ can be substantially parallel to substrate 102. In some embodiments, first layer 124A's bottom surface can be substantially coplanar and in contact with second top surface $108_B$. In some embodiments, first layer 124A's bottom surface can be S/D region 124's bottom surface. In some embodiments, first layer 124A's top surface can be below or substantially coplanar with portions of gate spacer 104 that is over fin structure 108's side surfaces. First layer 124A can be made of an epitaxially-grown semiconductor material, such as a compound semiconductor material (e.g., SiGe). In some embodiments, first layer 124A can be made of SiGe with the atomic concentration of germanium less than about 35%, such as from about 5% to about 30%, to reduce crystal defects of second layer 124B and third layer 124C (discussed below). In some embodiments, first layer 124A can be made of SiGe with a substantially constant atomic concentration of germanium or a gradient atomic concentration of germanium (shown in FIGS. 1D and 1E that respectively illustrate S/D region 124's atomic concentration of germanium along FIG. 1C's line M-M and FIG. 1C's line N-N) gradually increasing along a direction away from fin structure 108. First layer 124A can be doped with p-type dopants, such as boron, indium, aluminum, gallium, zinc, beryllium, and magnesium. In some embodiments, first layer 124A can be doped with p-type dopants having a doping concentration less than $5\times10^{20}$/cm$^3$ such as from about $5\times10^{19}$/cm$^3$ to about $5\times10^{20}$/cm$^3$, to mitigate short channel effects of FET 101. In some embodiments, first layer 124A can be doped with p-type dopants having a substantially constant doping concentration or a gradient doping concentration (shown in FIGS. 1D and 1E that respectively illustrate S/D region 124's doping concentration along FIG. 1C's line M-M and FIG. 1C's line N-N) gradually increasing along a vertical direction away from fin structure 108. In some embodiments, first layer 124A can be doped with n-type dopants, such as phosphorus and arsenic, or intrinsic dopants, such as iron and chromium.

S/D region 124 can further include a second layer 124B formed over first layer 124A. Second layer 124B can be made of a compound semiconductor, such as SiGe. In some embodiments, first and second layers 124A and 124B can be made of SiGe, where second layer 124B can have a greater atomic concentration of germanium than first layer 124A to provide stress to enhance FET 101's channel mobility. For example, second layer 124B can be made of SiGe with the atomic concentration of germanium from about 30% to about 50%. In some embodiments, second layer 124B can be made of SiGe with a substantially constant atomic concentration of germanium or an atomic concentration of germanium (shown in FIGS. 1D and 1E) gradually increasing along a direction away from first layer 124A. Second layer 124B can be doped with p-type dopants, such as boron, indium, aluminum, gallium, zinc, beryllium, and magnesium. Second layer 124B can be doped having a greater doping concentration than first layer 124A to provide a low contact resistance for FET 101. For example, second layer 124B can be doped with p-type dopants having a doping concentration greater than or substantially equal to about $5\times10^{20}$/cm$^3$, such as from about $5\times10^{20}$/cm$^3$ to about $1\times10^{21}$/cm$^3$, to provide a low contact resistance for FET 101. In some embodiments, second layer 124B can be doped with p-type dopants having a substantially constant doping concentration or a gradient doping concentration (shown in FIGS. 1D and 1E) gradually increasing along a direction away from first layer 124A. In some embodiments, second layer 124B can be doped with n-type dopants, such as phosphorus and arsenic, or intrinsic dopants, such as iron and chromium.

S/D region 124 can further include a third layer 124C formed over second layer 124B. Third layer 124C can be made of a compound semiconductor, such as SiGe. In some embodiments, second and third layers 124B and 124C can be made of SiGe, where third layer 124C can have an atomic concentration of germanium greater than or substantially equal to second layer 124B to provide stress to enhance FET 101's channel mobility. For example, third layer 124C can be made of SiGe with the atomic concentration of germanium from about 45% to about 65%. In some embodiments, third layer 124C can include SiGe with a substantially constant atomic concentration of germanium or an atomic concentration of germanium (shown in FIGS. 1D and 1E) gradually increasing along a direction away from second layer 124B. In some embodiments, third layer 124C's volume can have be greater than first layer 124A's volume and/or second layer 124B's volume to provide stress to enhance FET 101's channel mobility. Third layer 124C can be doped with p-type dopants, such as boron, indium, aluminum, gallium, zinc, beryllium, and magnesium. Third layer 124C can be doped with a substantially equal or a greater doping concentration than first layer 124A and/or second layer 124B to provide a low contact resistance for FET 101. For example, third layer 124C can be doped with p-type dopants having a doping concentration greater than or substantially equal to about $1\times10^{21}$/cm$^3$, such as from about $1\times10^{21}$/cm$^3$ to about $3\times10^{21}$/cm$^3$, to provide a low contact resistance for FET 101. In some embodiments, third layer 124C can be doped with p-type dopants having a substantially constant doping concentration or a gradient doping concentration (shown in FIGS. 1D and 1E) gradually increasing along a direction away from second layer 124B. In some embodiments, third layer 124C can be doped with n-type dopants, such as phosphorus and arsenic, or intrinsic dopants, such as iron and chromium. In some embodiments, at least one of S/D region 124's side surfaces $124_{S1A}$ and $124_{S1B}$ can be made of third layer 124C. In some embodiments, side surfaces $124_{S1A}$ and $124_{S1B}$ can be in contact with (ILD) layer 130 (discussed below) and/or in contact with silicide layer 152 (discussed below). In some embodiments, side surfaces $124_{S1A}$ and $124_{S1B}$ can be substantially perpendicular to substrate 102. In some embodiments, side surfaces $124_{S1A}$ and $124_{S1B}$ can be (110) crystal planes. In some embodiments, S/D region 124 can further include side surfaces $124_{S3A}$ and $124_{S3B}$ proximate to S/D region 124's bottom surface (e.g., such as proximate to second top surface $108_B$), where side surfaces $124_{S3A}$ and $124_{S3B}$ can be made of third layer 124C. In some embodiments, side surfaces $124_{S3A}$ and $124_{S3B}$ can be (111) crystal planes. In some embodiments, side surfaces $124_{S3A}$ and $124_{S3B}$ can be in contact with gate spacers 104 that are formed over fin structure 108's side surfaces. In some embodiments, side surfaces $124_{S3A}$ and/or $124_{S3B}$ can be separated from gate spacers 104 that are formed over fin structure 108's side surfaces.

S/D region 124 can further include a capping layer 124D formed over third layer 124C. In some embodiments, capping layer 124D's top surface can be S/D region 124's top surface $124_T$. In some embodiments, top surface $124_T$ can include (111) or (100) crystal planes. In some embodiments, top surface $124_T$ can be free from (100) crystal planes (e.g., top surface $124_T$ only includes (111) crystal planes). Capping layer 124D can be made of a compound semiconductor, such as SiGe. In some embodiments, third layer 124C and capping layer 124D can be made of SiGe, where capping layer 124D can have an atomic concentration of germanium less than or substantially equal to third layer 124C to form a silicide layer 152 (discussed below at method 200) with a low sheet resistance. For example, capping layer 124D can be made of SiGe with the atomic concentration of germanium less than about 60%, such as from about 40% to about 60%. In some embodiments, capping layer 124D can include SiGe with a substantially constant atomic concentration of germanium or a gradient atomic concentration of germanium (shown in FIG. 1D) gradually decreasing along a direction away from third layer 124C. Capping layer 124D can be doped with p-type dopants, such as boron, indium, aluminum, gallium, zinc, beryllium, and magnesium. Capping layer 124D can be doped with any suitable doping concentration to provide a low contact resistance for FET 101. In some embodiments, capping layer 124D can be doped with p-type dopants having a doping concentration from to about $5\times10^{20}/cm^3$ to about $2\times10^{21}/cm^3$ to provide a low contact resistance for FET 101. In some embodiments, capping layer 124D can be doped with p-type dopants having a substantially constant doping concentration or a gradient doping concentration (shown in FIG. 1D) gradually decreasing along a direction away from third layer 124C. In some embodiments, capping layer 124D and first layer 124A can be doped with p-type dopants, where the doping concentration of capping layer 124D can be greater the doping concentration of first layer 124A. In some embodiments, capping layer 124D and second layer 124B can be doped with p-type dopants, where the doping concentration of capping layer 124D can be substantially equal to the doping concentration of second layer 124B. In some embodiments, first layer 124A, second layer 124B, third layer 124C, and capping layer 124D can be doped with p-type dopants, where the doping concentration of third layer 124C can be greater than those of first layer 124A, second layer 124B, and capping layer 124D. In some embodiments, capping layer 124D can be doped with n-type dopants, such as phosphorus and arsenic, or intrinsic dopants, such as iron and chromium. In some embodiments, S/D region 124 can further include side surfaces $124_{S2A}$ and $124_{S2B}$ proximate to S/D region 124's top surface $124_T$, where side surfaces $124_{S2A}$ and $124_{S2B}$ can be made of capping layer 124D. In some embodiments, side surfaces $124_{S2A}$ and $124_{S2B}$ can be (111) crystal planes. In some embodiments, side surfaces $124_{S2A}$ and $124_{S2B}$ can be in contact with an interlayer dielectric (ILD) layer 130 (discussed below) and/or silicide layer 152 (discussed below). In some embodiments, S/D region 124's side surfaces $124_{S1A}$ and/or $124_{S1B}$ can be made of capping layer 124D.

Semiconductor device 100 can further include an interlayer dielectric (ILD) layer 130 to provide electrical isolation to structural elements it surrounds or covers, such as gate structure 110 and S/D regions 124. In some embodiments, two laterally (e.g., in the y-direction) adjacent S/D regions 124 may need to be separated greater than or substantially equal to about 3 nm or about 5 nm to ensure ILD layer 130 being formed between the two laterally adjacent S/D regions 124. If the above-noted separation is below the above-noted lower limits, ILD layer 130 may not be able to be formed between the two laterally adjacent S/D regions 124 due to the gap fill limitation of the deposition process (discussed at operation 230) associated with ILD layer 130. ILD layer 130 can include any suitable dielectric material to provide electrical insulation, such as silicon oxide, silicon dioxide, silicon oxycarbide, silicon oxynitride, silicon oxy-carbon nitride, and silicon carbonitride. ILD layer 130 can have any suitable thickness, such as from about 50 nm to about 200 nm, to provide electrical insulation. Based on the disclosure herein, other insulating materials and thicknesses for ILD layer 130 are within the scope and spirit of this disclosure.

Semiconductor device 100 can further include a layer of insulating material 148 formed over gate structure 110 and ILD layer 130. Layer of insulating material 148 can be further formed over S/D region 124, and trench conductor structure 150 can be formed through layer of insulating material 148 to contact S/D region 124. Layer of insulating material 148 can be made of any suitable insulating material, such as silicon oxide, silicon nitride, a low-k dielectric material, and a high-k dielectric material. Further, layer of insulating material 148 can be made of any suitable thickness, such as from about 10 nm to about 400 nm, that can provide sufficient electrical insulation between FETs 101 and an interconnect structure (not shown in FIGS. 1A-1C) formed over FETs 101. Based on the disclosure herein, other insulating materials and thicknesses for layer of insulating material 148 are within the scope and spirit of this disclosure.

Semiconductor device 100 can further include a trench conductor structure 150 formed through layer of insulating material 148. Trench conductor structure 150 can electrically connect FET 101's S/D region 124 to the interconnect structure (not shown in FIGS. 1A-1C) formed over FET 101. Trench conductor structure 150 can have a lateral width $W_{150}$ from about 5 nm to about 40 nm, from about 8 nm to about 30 nm, or from about 8 nm to about 25 nm. If width $W_{150}$ is below the above-noted lower limits, the contact resistance between trench conductor layer 150 and S/D region 124 may be increased to degrade FET 101's performance. If width $W_{150}$ is beyond the above-noted upper limits, semiconductor device 100 may not meet the fin pitch requirement determined by the respective technology node (e.g., fin pitch may be required to be less than about 60 nm for a 22 nm technology node), thus failing the product requirement of the IC. Further, because S/D region 124 can have a reduced lateral dimension (e.g., width $W_{124}$) to avoid or reduce the RSD loss, trench conductor structure 150 can contact a majority of S/D region 124's top surface $124_T$. For example, a ratio of trench conductor structure 150's width $W_{150}$ to S/D region 124's width $W_{124}$ can be from about 0.5 to about 1.5, from about 0.7 to about 1.3, from about 0.7 to about 1.2, from about 0.8 to about 1.1, or from about 0.9 to about 1.1. If the ratio of width $W_{150}$ to width $W_{124}$ is below the above-noted lower limits (e.g., S/D region 124's width $W_{124}$ is too wide), S/D region 124 may be susceptible to RSD loss and/or may not provide sufficient stress to drive FET 101's channel. If the ratio of width $W_{150}$ to width $W_{124}$ is beyond the above-noted upper limits (e.g., trench conductor structure 150's width $W_{150}$ is too wide), semiconductor device 100 may not meet the fin pitch requirement determined by the respective technology node (e.g., fin pitch may be required to be less than about 60 nm for a 22 nm technology node), thus failing the product requirements of the IC. In some embodiments, trench conductor structure 150's width $W_{150}$ can be greater than S/D region 124's width $W_{124}$, and trench conductor structure 150 can contact a majority of S/D region 124's side surfaces $124_{S1A}$, $124_{S1B}$, $124_{S2A}$, and/or $124_{S2B}$. For example, trench conductor structure 150 can contact more than about 50%, more than about 70%, or more than about 90% of the areas of side surfaces $124_{S1A}$, $124_{S1B}$, $124_{S2A}$, and/or $124_{S2B}$. In some embodiments, trench conductor structure 150 can connect FET 101's gate structure 110 to the interconnect structure formed over FET 101. In some embodiments, trench conductor structure 150 can protrude into S/D region 124. For example, as shown in FIGS. 1B and 1C, trench conductor structure 150 can include a silicide layer 152 protruding S/D region 124 and a layer of conductive material 154 formed over silicide layer 152. Silicide layer 152 can include a metal silicide material to provide a low resistance interface between layer of conductive material 154 and S/D region 124. For example, silicide layer 152 can be formed over and in contact with S/D region 124's top surface $124_T$ to provide a low resistance interface between layer of conductive material 154 and S/D region 124. In some embodiments, silicide layer 152 can be formed and in contact with the proximities of top surface $124_T$'s topmost vertex to provide a low resistance interface between layer of conductive material 154 and S/D region 124. In some embodiments, silicide layer 152 can be formed over and in contact with S/D region 124's side surfaces $124_{S2A}$ and $124_{S2B}$ that are proximate to S/D region 124's top surface $124_T$. In some embodiments, silicide layer 152 can be formed over and in contact with at least one of S/D region 124's side surfaces $124_{S1A}$ and $124_{S1B}$. The metal silicide material for silicide layer 152 can include titanium, cobalt, nickel, platinum, palladium, tungsten, molybdenum, tantalum, vanadium, chromium, silicon, or germanium. Layer of conductive material 154 can include any suitable conductive material that provide low resistance between silicide layer 152 and the interconnect structure (not shown in FIGS. 1A-1C) formed over FET 101. For example, layer of conductive material 154 can include a metallic material, such as copper, tungsten, aluminum, and cobalt. In some embodiments, layer of conductive material 154 can further include a stack of conductive materials (not shown in FIGS. 1A-1C), such as a conductive nitride material (e.g., titanium nitride or tantalum nitride), that can act as a diffusion barrier, an adhesion promotion layer, or a nucleation layer to embed the above-noted metallic materials in layer of insulating material 148. Based on the disclosure herein, other materials for silicide layer 152 and layer of conductive material 154 are within the scope and spirit of this disclosure.

In some embodiments, silicide layer 152 can be formed protruding S/D region 124's capping layer 124D, where S/D region 124's top surface $124_T$ can be made of capping layer 124D. In some embodiments, silicide layer 152 can be formed through S/D region 124's capping layer 124D and protruding S/D region 124's third layer 124C, where S/D region 124's top surface $124_T$ can be made of third layer 124C (not shown in FIGS. 1B and 1C). In some embodiments, silicide layer 152 can be formed through S/D region 124's capping layer 124D and third layer 124C, and protruding S/D region 124's second layer 124B, where S/D region 124's top surface $124_T$ can be made of second layer 124B (not shown in FIGS. 1B and 1C).

In some embodiments, referring to FIGS. 1B and 1C, separation $S_{152}$ can be a vertical (e.g., in the z-direction) separation between S/D region 124's bottom surface and the proximity of topmost vertex of silicide layer 152's top surface, where a ratio of separation $S_{152}$ to width $W_{124}$ can be greater than about 1.0, greater than about 1.5, greater than about 2.0, greater than about 3.0, or greater than about 5.0. If the ratio of separation $S_{152}$ to width $W_{124}$ is below the above-noted lower limits, S/D region 124 may be susceptible to RSD loss and/or may not provide sufficient stress to drive FET 101's channel.

Figure 2:
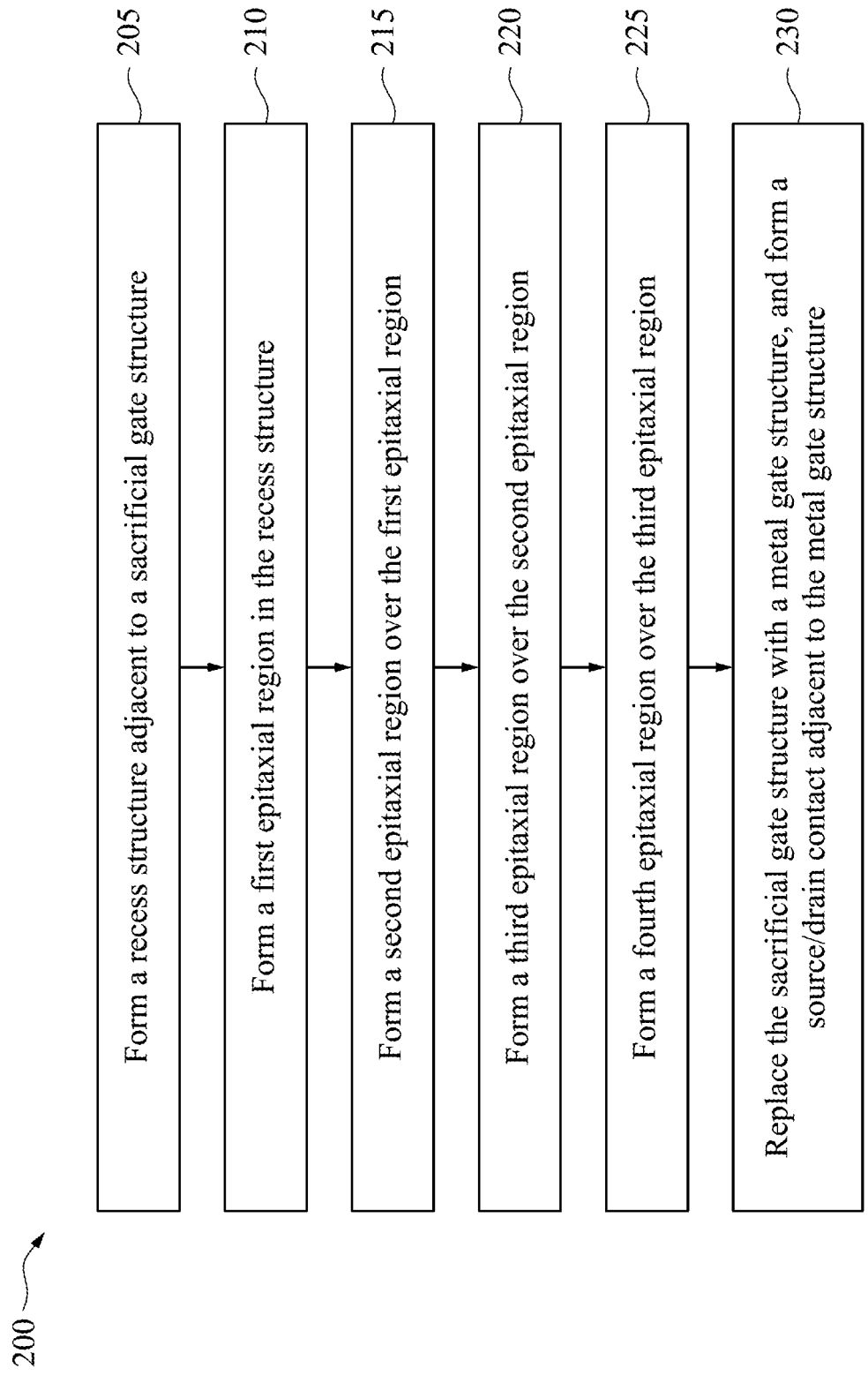
FIG. 2 is a flow diagram of a method for fabricating a semiconductor device, according to some embodiments.
Figure 8B:
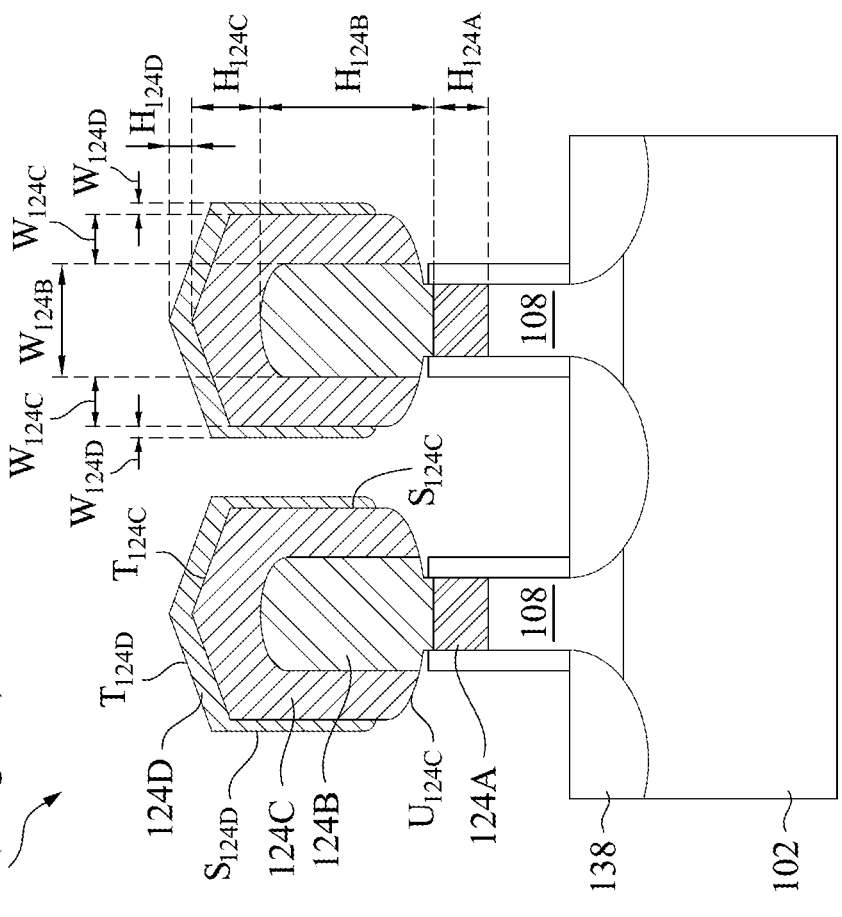
Figure 8A:
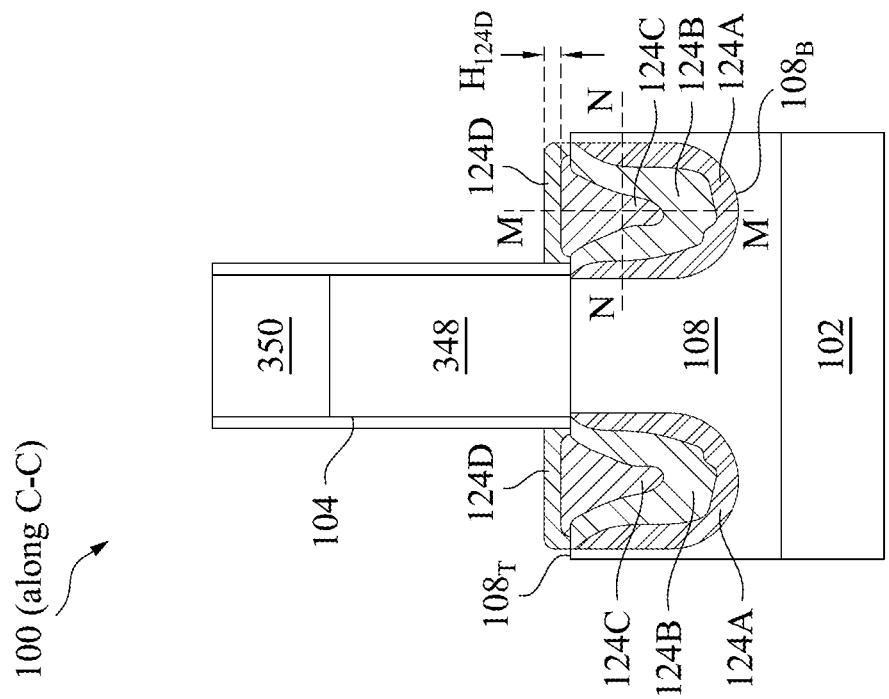
Figure 9:
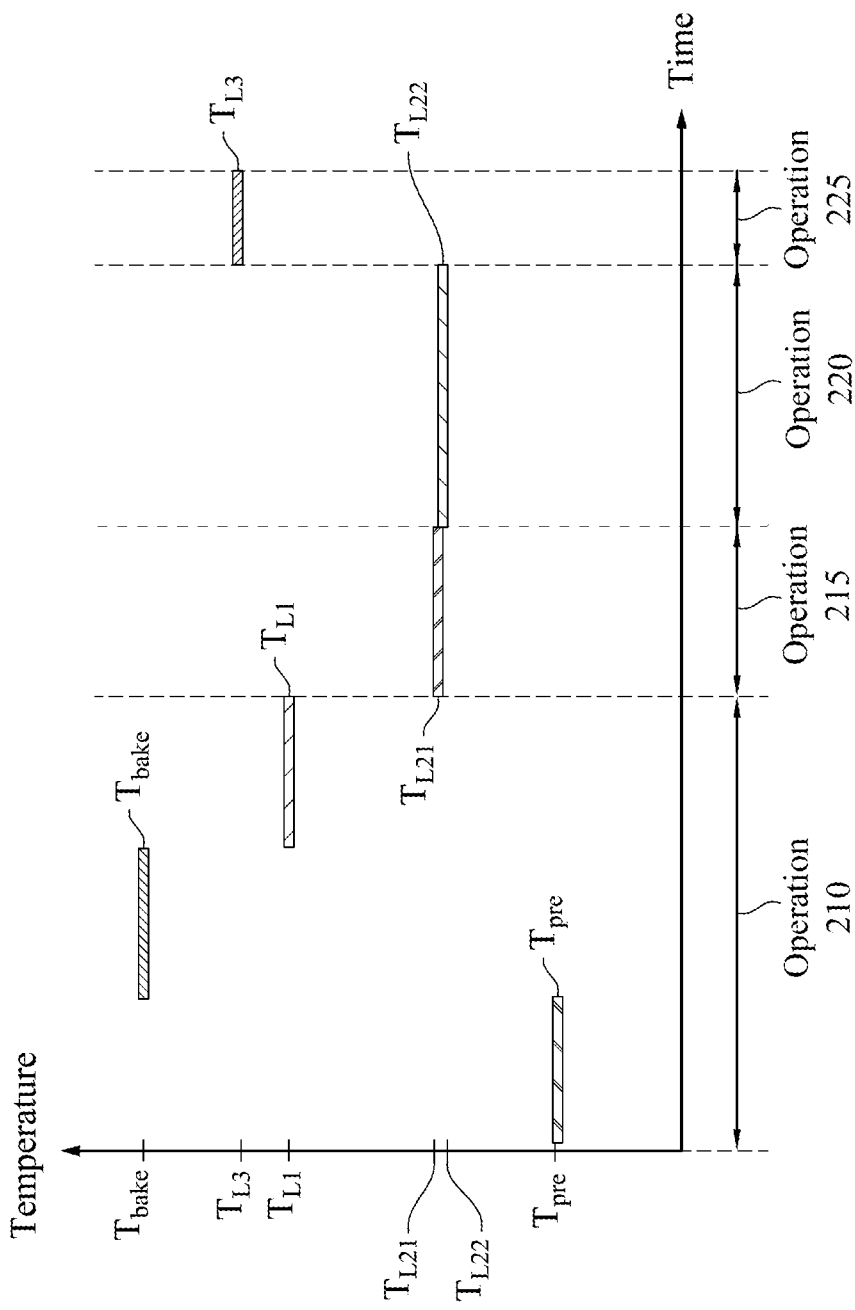
FIG. 9 illustrates a temperature profiles of an epitaxial growth process for a semiconductor device, according to some embodiments.
Figure 11B:
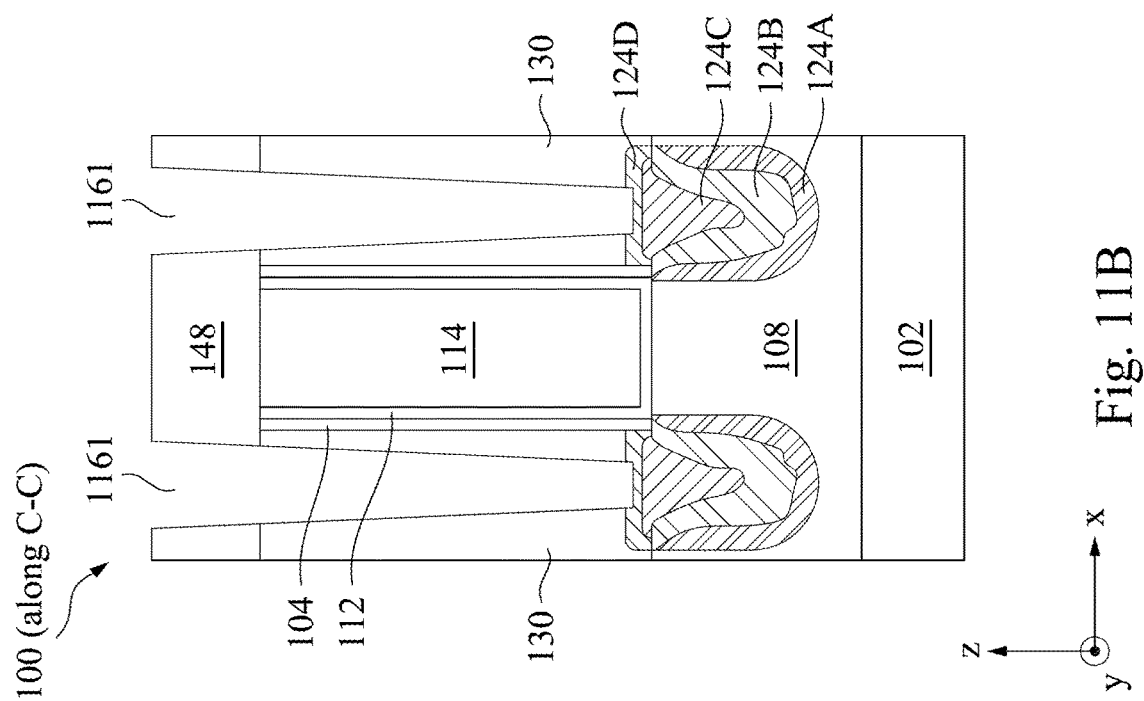
Figure 11A:
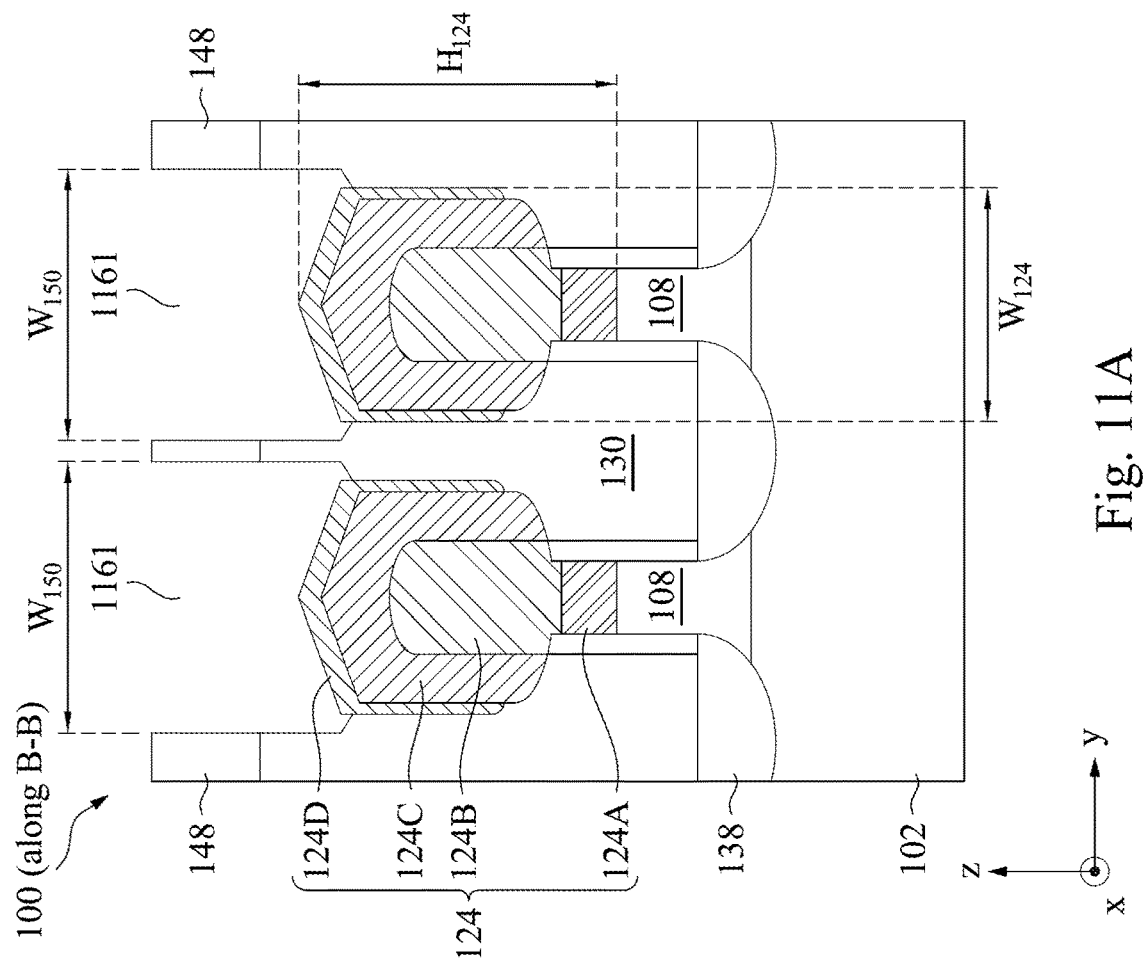

FIG. 2 is a flow diagram of a method 200 for fabricating semiconductor device 100, according to some embodiments. For illustrative purposes, the operations illustrated in FIG. 2 will be described with reference to the example fabrication process for fabricating semiconductor device 100 as illustrated in FIGS. 3A-8A, 3B-8B, 9, 10A-11A, and 10B-11B. FIGS. 3A-8A and 10A-11A illustrate cross-sectional views along lines B-B of structure of FIG. 1A at various stages of its fabrication, according to some embodiments. FIGS. 3B-8B and 10B-11B illustrate cross-sectional views along lines C-C of structure of FIG. 1A at various stages of its fabrication, according to some embodiments. FIG. 9 illustrates the growth temperatures for epitaxially growing S/D region 124 in method 200, according to some embodiments. Operations can be performed in a different order or not performed depending on specific applications. Method 200 may not produce a complete semiconductor device 100. Accordingly, it is understood that additional processes can be provided before, during, and/or after method 200, and that some other processes may be briefly described herein. Further, the discussion of elements in FIGS. 1A-1E, 3A-8A, 3B-8B, 9, 10A-11A, and 10B-11B with the same annotations applies to each other, unless mentioned otherwise.

Referring to FIG. 2, in operation 205, a recess structure is formed adjacent to a sacrificial gate structure. For example, a recess structure 436 (shown in FIGS. 4A and 4B) can be formed over substrate 102 and adjacent to a sacrificial gate structure 310 with reference to FIGS. 3A-4A and 3B-4B. The process of forming recess structure 436 can include (i) forming fin structures 108 (shown in FIGS. 3A and 3B) with a width $W_{108}$ over substrate 102; (ii) forming sacrificial gate structures 310 (shown in FIGS. 3A and 3B) over fin structures 108; and (iii) removing fin structures 108 through sacrificial gate structures 310 to form recess structure 436.

Figure 3B:
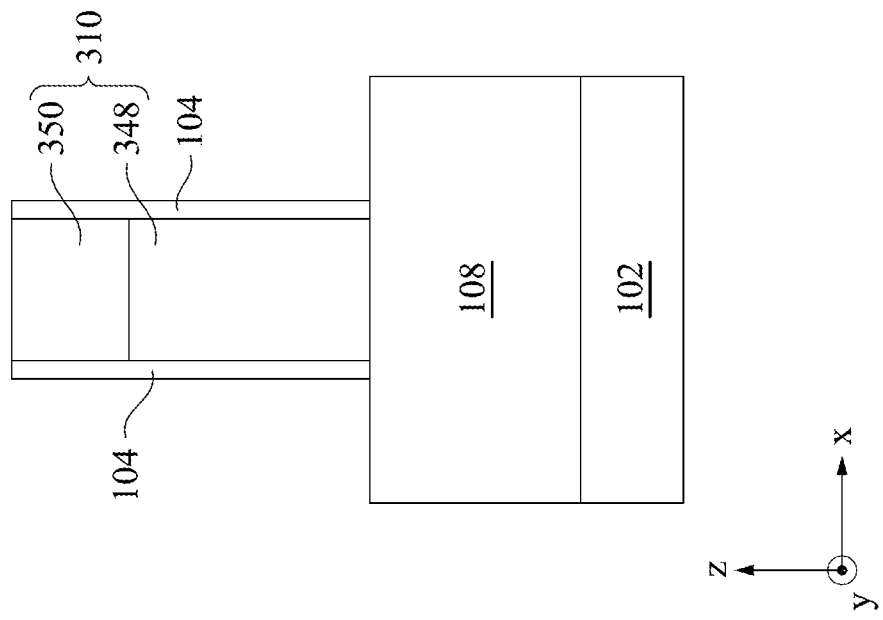
Figure 3A:
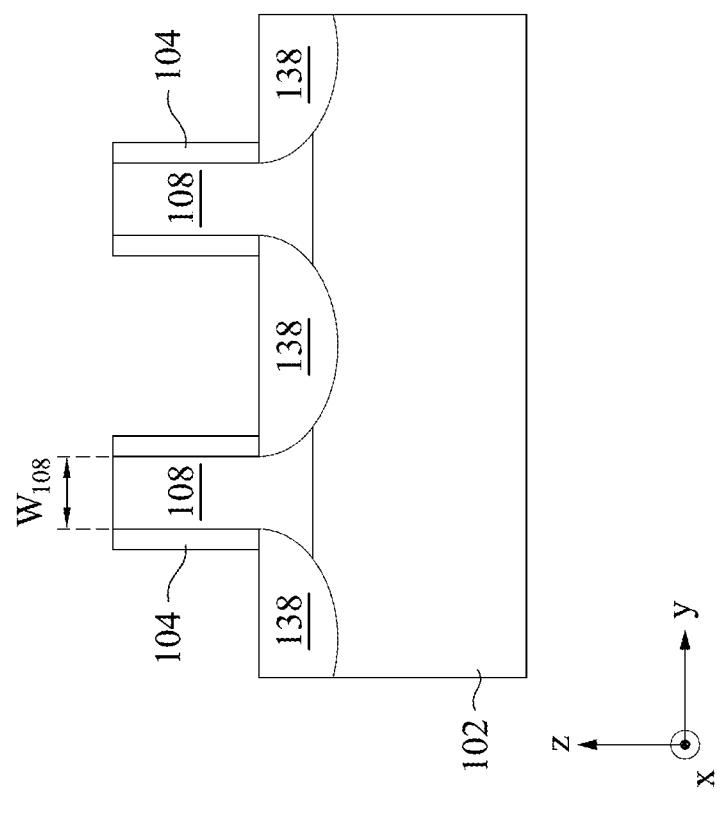

Referring to FIGS. 3A and 3B, the process of forming fin structures 108 can include (i) providing substrate 102; (ii) etching substrate 102 through a patterned mask layer (not shown in FIGS. 3A and 3B) using an etch process to define fin structure 108's width $W_{108}$; and (iii) forming STI region 138 over the etched substrate 102 using a deposition process and an etch back process. In some embodiments, the process of forming fin structures 108 can include (i) epitaxially growing a channel layer (e.g., a SiGe layer) over substrate 102 using an epitaxial growth process, and (ii) etching the channel layer through the patterned mask layer (not shown in FIGS. 3A and 3B) using the etch process. The etch process can include a dry etch process or a wet etch process. In some embodiments, the dry etch process can include using any suitable etchant, such as an oxygen-containing gas, a fluorine-containing gas, a chlorine-containing gas, and a bromine-containing gas, and the wet etch process can include etching in any suitable wet etchant, such as diluted hydrofluoric acid, potassium hydroxide solution, ammonia, and nitric acid. The resulting fin structure 108's width $W_{108}$ can be any suitable width, such as from about 5 nm to about 30 nm, that can provide short channel control for FET 101. In some embodiments, width $W_{108}$ can be substantially equal to fin structure 108's width after method 200. In some embodiments, the deposition process for forming STI region 138 can include any suitable growth process, such as a physical vapor deposition (PVD) process, a chemical vapor deposition (CVD) process, a high-density-plasma (HDP) CVD process, a flowable CVD (FCVD) process, and an atomic layer deposition (ALD) process. In some embodiments, the etch back process for forming STI region 138 can include a dry etch process, a wet etch process, or a polishing process, such as chemical mechanical polishing (CMP) process. Based on the disclosure herein, other processes for forming fin structures 108 are within the spirit and scope of this disclosure.

The process of forming sacrificial gate structure 310 can include (i) blanket depositing a polysilicon layer 348 and a hard mask layer 350 over fin structures 108 using a suitable deposition process, such as a CVD process, a PVD process, and an ALD process; (ii) removing polysilicon layer 348 and hard mask layer 350 through a patterned mask layer (not shown in FIGS. 3A and 3B) using an etching process; and (iii) forming gate spacers 104 over side surfaces of polysilicon layer 348 and/or over fin structure 108's side surfaces using a suitable deposition process and an etch process. Based on the disclosure herein, other processes for forming gate structures 310 are within the spirit and scope of this disclosure.

After forming sacrificial gate structure 310, recess structure 436 can be formed by removing fin structures 108 through sacrificial gate structures 310 using an etching process. The etching process can include a dry etch process or a wet etch process. In some embodiments, the etching process can be a time-etch process. In some embodiments, the dry etch process can include using any suitable etchant, such as an oxygen-containing gas, a fluorine-containing gas, a chlorine-containing gas, and a bromine-containing gas, and the wet etch process can include etching in any suitable wet etchant, such as diluted hydrofluoric acid, potassium hydroxide solution, ammonia, and nitric acid. The resulting recess structure 436 can span with length $L_{124}$ associated with two adjacent sacrificial gate structure 310's separation. Further, the resulting recess structure 436 can protrude in fin structure 108 with a depth $H_{436}$ to define first top surface $108_T$ outside recess structure 436 and second top surface $108_B$ within recess structure 436. In some embodiments, depth $H_{436}$ can be less than or substantially equal to S/D region 124's height $H_{124}$ (shown in FIGS. 1B and 1C). In some embodiments, the resulting recess structure 436 can protrude into fin structure 108 to form second top surface $108_E$ vertically (e.g., in the z-direction) below gate spacers 104 that are formed over fin structure 108's side surface.

Referring to FIG. 2, in operation 210, a first epitaxial region is formed in the recess structure. For example, first layer 124A (shown in FIGS. 5A and 5B) can be formed in recess structure 436 of FIGS. 4A and 4B with reference to FIGS. 5A, 5B, and 9. The process of forming first layer 124A can include (i) annealing the structure of FIG. 4A to desorb contaminants (e.g., hydrocarbon) from recess structure 436's surface with a suitable annealing temperature $T_p$re (shown in FIG. 9), such as about 200° C.; (ii) annealing the structure of FIG. 4A to desorb native oxides (e.g., silicon oxide and/or germanium oxide) from recess structure 436's surface with an annealing temperature $T_{bake}$ (shown in FIG. 9); and (iii) epitaxially growing a semiconductor material of using an epitaxial growth process with a growth temperature $T_{L1}$ (shown in FIG. 9). In some embodiments, annealing temperature $T_{bake}$ can be greater than annealing temperature $T_p$re and growth temperature $T_{L1}$ to effectively desorb native oxides from recess structure 436. The epitaxial growth process for first layer 124A can include (i) a CVD process, such as a low pressure CVD (LPCVD) process, a rapid thermal CVD (RTCVD) process, a metal-organic CVD (MOCVD) process, an atomic layer CVD (ALCVD) process, an ultrahigh vacuum CVD (UHVCVD) process, and a reduced pressure CVD (RPCVD) process; (ii) a molecular beam epitaxy (MBE) process; (iii) an epitaxial deposition/partial etch process, such as a cyclic deposition-etch (CDE) process; or (iv) a selective epitaxial growth (SEG) process. The epitaxial growth process can be performed using suitable lower-order precursors or higher-order precursors to epitaxially grow the semiconductor material for first layer 124A. Lower-order precursor and a higher-order precursor can include a common chemical element (e.g., Si or Ge) as S/D region 124, where the higher-order precursor can have a greater molecular weight than the lower-order precursor. For example, first layer 124A can include SiGe, where the respective lower-order precursor can include silane ($SiH_4$), disilane ($Si_2H_6$), dichlorosilane (DCS), or germane ($GeH_4$), and the respective higher-order precursor can include disilane ($Si_2H_6$), trisilane ($Si_3H_8$), or digermane ($Ge_2H_6$). In some embodiments, the epitaxial growth process for first layer 124A can have a higher growth rate over a (100) crystal plane than over the (110) or (111) crystal plane by solely using the higher-order precursor in the epitaxial growth process. The epitaxial growth process for first layer 124A can further include doping the grown semiconductor material with p-type dopants or n-type dopants. For example, the epitaxial growth process can be performed using suitable dopant precursors, such as diborane ($B_2H_6$), boron difluoride ($BF_2$), and boron trifluoride ($BF_3$), to dope boron (e.g., a p-type dopant) in first layer 124A with a suitable doping concentration. Accordingly, the epitaxial growth process for first layer 124A can result in doped first layer 124A of vertical thickness $H_{124A}$ measured from second top surface $108_B$. In some embodiments, the epitaxial growth process for first layer 124A can result in first layer 124A with vertical thickness $H_{124A}$ greater than first layer 124A's width, because the epitaxial growth process can epitaxially grow first layer 124A with a faster growth rate over the (100) crystal plane (e.g., over second top surface $108_B$) than over the (110) or (111) crystal planes (e.g., over recess structure 436's side surfaces). In some embodiments, first layer 124A's thickness $H_{124A}$ can be substantially equal to first layer 124A's thickness of the resulting S/D region 124 (shown in FIGS. 1B and 1C) after method 200. In some embodiments, the epitaxial growth process for first layer 124A can result in first layer 124A with a top surface $T_{124A}$ substantially parallel to substrate 102. In some embodiments, first layer 124A's top surface $T_{124A}$ can include a (100) crystal plane. In some embodiments, first layer 124A's top surface $T_{124A}$ can be vertically (e.g., in the z-direction) below or substantially coplanar with gate spacers 104 formed over fin structure 108's side surfaces. For example, first layer 124A can have vertical thickness $H_{124A}$ less than about 20 nm, such as from about 5 nm to about 20 nm. If vertical thickness $H_{124A}$ is beyond the above-noted upper limits, second layer 124B (discussed at operation 215) may be grown on first layer 124A's side surfaces, thus resulting in second layer 124B with vertical thickness $H_{124B}$ equal to or less than width $W_{124B}$ which can cause S/D region 124 to be susceptible to the RSD loss or the RSD merging after method 200. If vertical thickness $H_{124A}$ is below than the above-noted lower limits, first layer 124A may not reconcile a lattice mismatch between second layer 124B and fin structure 108, thus failing to reduce crystal defects of second layer 124B. In some embodiments, the epitaxial growth process for first layer 124A can result in first layer 124A under and in contact with gate spacer 104. In some embodiments, the epitaxial growth process for first layer 124A can further include applying an etching gas, such as hydrogen chloride (HCl), to etch a portion of the grown first layer 124A to expose fin structure 108's first top surface $108_T$ (shown in FIG. 5B).

Referring to FIG. 2, in operation 215, a second epitaxial region is formed over the first epitaxial region. For example, second layer 124B (shown in FIGS. 6A and 6B) can be formed over first layer 124A of FIGS. 5A and 5B with reference to FIGS. 6A, 6B, and 9. The process of forming second layer 124B can include epitaxially growing a semiconductor material over first layer 124A using an epitaxial growth process with a growth temperature $T_{L21}$ (shown in FIG. 9). Growth temperature $T_{L21}$ can be less than growth temperature $T_{L1}$ to increase the epitaxial growth process's growth rate over a (100) crystal plane (e.g., over first layer 124A's top surface $T_{124A}$) and decrease epitaxial growth process's growth rate over the (110) or (110) crystal planes (e.g., over first layer 124A's side surfaces). Accordingly, the epitaxial growth process for second layer 124B can result in second layer 124B with a width $W_{124B}$ and a vertical thickness $H_{124B}$ greater than width $W_{124B}$. Subsequently, second layer 124B with vertical thickness $H_{124B}$ greater than width $W_{124B}$ can result in S/D region 124 with height $H_{124}$ greater than width $W_{124}$ after method 200. In some embodiments, with growth temperature $T_{L21}$ being less than growth temperature $T_{L1}$, a ratio of second layer 124B's height $H_{124B}$ to second layer 124B's width $W_{124B}$ can be greater than about 1.0, greater than about 1.5, greater than about 2.0, greater than about 3.0, or greater than about 5.0. If the above-noted ratio is below the above-noted lower limits, the resulting S/D region 124 after method 200 may not have height $H_{124}$ greater than width $W_{124}$, thus being susceptible to RSD loss and/or RSD merging (discussed previously at FIGS. 1B and 1C). In some embodiments, growth temperature $T_{L21}$ can be from about 250° C. to about 550° C., from about 300° C. to about 500° C., or from about 300° C. to about 450° C. to result in second layer 124B with vertical thickness $H_{124B}$ greater than width $W_{124B}$. If growth temperature $T_{L21}$ is below the above-noted lower limits, the epitaxial growth process may result in an amorphous second layer 124B or a polycrystalline second layer 124B, thus degrading FET 101's speed and yield. If growth temperature $T_{L21}$ is beyond the above-noted upper limits, the epitaxial growth process may provide similar growth rates between (100) crystal plane and (110)/(111) crystal planes, thus resulting in second layer 124B with vertical thickness $H_{124B}$ equal to or less than width $W_{124B}$ which can cause S/D region 124 being susceptible to the RSD loss or the RSD merging. In some embodiments, a difference between growth temperature $T_{L1}$ and $T_{L21}$ can be from about 100° C. to about 400° C., from about 100° C. to about 300° C., or from about 100° C. to about 250° C. If the above-noted growth temperature difference is beyond the above-noted upper limits, the epitaxial growth process may result in an amorphous second layer 124B or a polycrystalline second layer 124B, thus degrading FET 101's speed and yield. If the above-noted growth temperature difference is below the above-noted lower limits, the epitaxial growth process may provide similar growth rates over the (100) crystal plane and over (110)/(111) crystal planes, thus resulting in second layer 124B with vertical thickness $H_{124B}$ equal to or less than width $W_{124B}$ which can cause S/D region 124 to be susceptible to RSD loss or RSD merging. In some embodiments, second layer 124B's width $W_{124B}$ and thickness $H_{124B}$ can be substantially equal to second layer 124B's width and thickness of the resulting S/D region 124 (shown in FIGS. 1B and 1C) after method 200. The epitaxial growth process for second layer 124B can include a CVD process, an LPCVD process, a RTCVD process, an MOCVD process, an ALCVD process, an UHVCVD process, a RPCVD process, an MBE process, a CDE process, or an SEG process. In some embodiments, with growth temperature $T_{L21}$ being less than growth temperature $T_{L1}$, the growth rate (e.g., over the (100), (111), and (110) crystal planes) of the epitaxial growth process for second layer 124B can be less than the respective growth rate (e.g., over the (100), (111), and (110) crystal planes) of the epitaxial growth process for first layer 124A. In some embodiments, with growth temperature $T_{L21}$ being less than growth temperature $T_{L1}$, the epitaxial growth process for second layer 124B can be performed using higher-order precursors to boost the growth rate of second layer 124B (e.g., the epitaxial growth process for second layer 124B is free from using lower-order precursors). In some embodiments, the epitaxial growth process for second layer 124B can be performed solely using higher-order precursors to increase the second layer 124B's growth rate over a (100) crystal plane and decrease second layer 124B's growth rate over the (110) or (111) crystal plane, thus resulting second layer 124B with vertical thickness $H_{124B}$ greater than width $W_{124B}$. The epitaxial growth process for second layer 124B can further include doping the grown semiconductor material with p-type dopants or n-type dopants. For example, the epitaxial growth process can be performed using suitable dopant precursors, such as $B_2H_6$, $BF_2$, and $BF_3$ to dope boron (e.g., a p-type dopant) in second layer 124B with a suitable doping concentration.

Figures 6A, 6B:
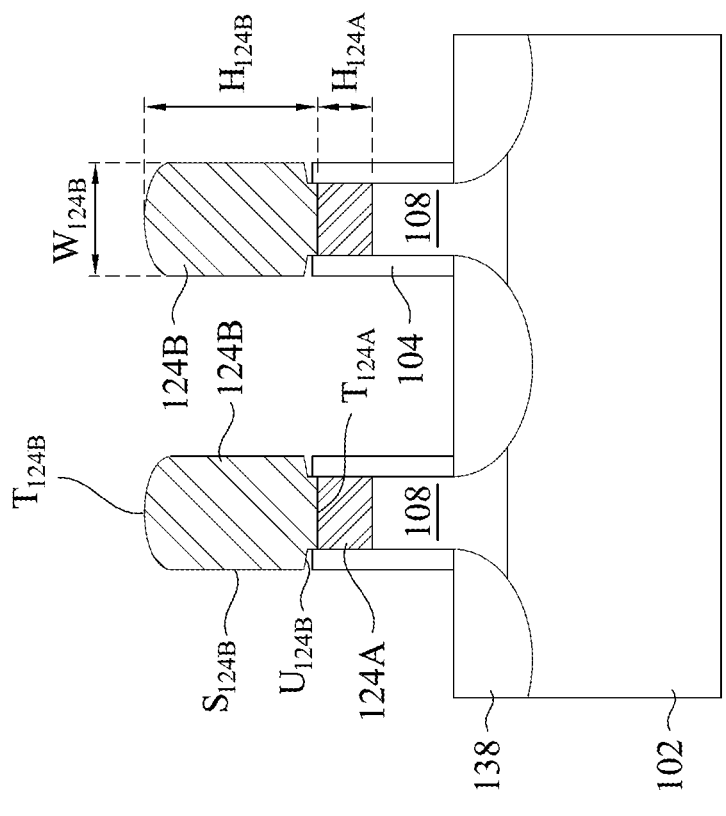

The epitaxial growth process for second layer 124B can further include an in-situ etching process to etch a portion of the grown semiconductor material by using an etching gas, such as HCl. The in-situ etching process can etch (110)/(111) crystal planes with a first etch rate, and the etching process can further etch (100) crystal planes with a second etch rate. With growth temperature $T_{L21}$ being less than growth temperature $T_{L1}$, the first etch rate can be greater than the second etch rate. Accordingly, the resulting second layer 124B can have vertical thickness $H_{124B}$ greater than width $W_{124B}$. Further, the resulting second layer 124B can exhibit side surfaces with (110) and/or (111) crystal planes. In some embodiments, as shown in FIG. 6A, the epitaxial growth process together with the in-situ etching process can form second layer 124B having a side surface S124B substantially perpendicular to substrate 102, because the epitaxial growth process together with the etching process has a lower growth rate and a higher etching rate over the (110) crystal plane. In some embodiments, side surface S124B can include a (110) crystal plane. In some embodiments, the epitaxial growth process together with the in-situ etching process can form second layer 124B having a side surface $U_{124B}$ proximate to first layer 124A's top surface $T_{124A}$, where side surface $U_{124B}$ can include a (111) crystal plane, because the epitaxial growth process together with the in-situ etching process has a lower growth rate and a higher etching rate over the (111) crystal plane. In some embodiments, the epitaxial growth process together with the in-situ etching process can form second layer 124B having a top surface $T_{124B}$ that can include a (100) crystal plane (proximate to top surface $T_{124B}$'s topmost vertex in FIG. 6A) or (111) crystal planes (shown in FIG. 6B) along the x-direction. In some embodiments, the in-situ etching process can etch a portion of the grown second layer 124B to expose fin structure 108's first top surface $108_T$ (shown in FIG. 6B).

Referring to FIG. 2, in operation 220, a third epitaxial region is formed over the second epitaxial region. For example, third layer 124C (shown in FIGS. 7A and 7B) can be formed over second layer 124B of FIGS. 6A and 6B with reference to FIGS. 7A, 7B, and 9. The process of forming third layer 124C can include epitaxially growing a semiconductor material over second layer 124B using an epitaxial growth process with a growth temperature $T_{L22}$ (shown in FIG. 9). Growth temperature $T_{L22}$ can be substantially equal to or less than growth temperature $T_{L21}$ to increase the epitaxial growth process's growth rate over a (100) crystal plane (e.g., over proximities of top surface $T_{124B}$'s topmost vertex in FIG. 6A) and decrease epitaxial growth process's growth rate over the (110) or (110) crystal planes (e.g., over second layer 124B's side surface S124B). Accordingly, the epitaxial growth process for third layer 124C can result in third layer 124C with a width $W_{124C}$ and a vertical thickness $H_{124C}$ greater than width $W_{124C}$. Subsequently, third layer 124C with vertical thickness $H_{124C}$ greater than width $W_{124C}$ can result in S/D region 124 with height $H_{124}$ greater than width $W_{124}$ after method 200. In some embodiments, with growth temperature $T_{L22}$ being substantially equal to or less than growth temperature $T_{L21}$, a ratio of third layer 124C's height $H_{124C}$ to third layer 124C's width $W_{124C}$ can be greater than about 1.0, greater than about 1.5, greater than about 2.0, greater than about 3.0, or greater than about 5.0. In some embodiments, with growth temperature $T_{L22}$ being substantially equal to or less than growth temperature $T_{L21}$, a ratio of the combination of second and third layers 124B's and 124C's heights (e.g., $H_{124B}+H_{124C}$) to the combination of second and third layers 124B's and twice of 124C's widths (e.g., $W_{124B}+2\times W_{124C}$) can be greater than about 1.0, greater than about 1.5, greater than about 2.0, greater than about 3.0, or greater than about 5.0. In some embodiments, growth temperature $T_{L22}$ can be from about 250° C. to about 550° C., from about 300° C. to about 500° C., or from about 300° C. to about 450° C. to result in third layer 124C with vertical thickness $H_{124C}$ greater than width $W_{124C}$. If growth temperature $T_{L22}$ is below the above-noted lower limits, the epitaxial growth process may result in an amorphous third layer 124C or a polycrystalline third layer 124C, thus degrading FET 101's speed and yield. If growth temperature $T_{L22}$ is beyond the above-noted upper limits, the epitaxial growth process may provide similar growth rates over the (100) crystal plane and over (110)/(111) crystal planes, thus resulting in third layer 124C with vertical thickness $H_{124C}$ equal to or less than width $W_{124C}$ which can cause S/D region 124 being susceptible to the RSD loss or the RSD merging. In some embodiments, a difference between growth temperature $T_{L1}$ and $T_{L22}$ can be from about 100° C. to about 400° C., from about 100° C. to about 300° C., or from about 100° C. to about 250° C. If the above-noted growth temperature difference is beyond the above-noted upper limits, the epitaxial growth process may result in an amorphous third layer 124C or a polycrystalline third layer 124C, thus degrading FET 101's speed and yield. If the above-noted growth temperature difference is below the above-noted lower limits, the epitaxial growth process may provide similar growth rates between the (100) crystal plane and (110)/(111) crystal planes, thus resulting in third layer 124C with vertical thickness $H_{124C}$ equal to or less than width $W_{124C}$ which can cause S/D region 124 to be suscep-tible to RSD loss or RSD merging. In some embodiments, third layer 124C's width $W_{124C}$ and thickness $H_{124C}$ can be substantially equal to third layer 124C's width and thickness of the resulting S/D region 124 (shown in FIGS. 1B and 1C) after method 200. The epitaxial growth process for third layer 124C can include a CVD process, an LPCVD process, a RTCVD process, an MOCVD process, an ALCVD process, an UHVCVD process, a RPCVD process, an MBE process, a CDE process, or an SEG process. In some embodiments, with growth temperature $T_{L22}$ being substantially equal to or less than growth temperature $T_{L21}$, the growth rate (e.g., over the (100), (111), and (110) crystal planes) of the epitaxial growth process for third layer 124C can be substantially equal to or less than the respective growth rate (e.g., over the (100), (111), and (110) crystal planes) of the epitaxial growth process for second layer 124B. In some embodiments, with growth temperature $T_{L22}$ substantially equal to or less than growth temperature $T_{L21}$, the epitaxial growth process for third layer 124C can be performed using higher-order precursors to boost the growth rate of third layer 124C (e.g., the epitaxial growth process for third layer 124C is free from using lower-order precursors). In some embodiments, the epitaxial growth process for third layer 124C can be performed solely using higher-order precursors to increase the third layer 124C's growth rate over a (100) crystal plane and decrease third layer 124C's growth rate over the (110) or (110) crystal plane, thus resulting third layer 124C with vertical thickness $H_{124C}$ greater than width $W_{124C}$. The epitaxial growth process for third layer 124C can further include doping the grown semiconductor material with p-type dopants or n-type dopants. For example, the epitaxial growth process can be performed using suitable dopant precursors, such as $B_2H_6$, $BF_2$, and $BF_3$, to dope boron (e.g., a p-type dopant) in third layer 124C with a suitable doping concentration.

The epitaxial growth process for third layer 124C can further include an in-situ etching process to etch a portion of the grown semiconductor material by using an etching gas, such as HCl and $SiH_4$. The in-situ etching process can etch (110)/(111) crystal planes with a first etch rate, and the etching process can further etch (100) crystal planes with a second etch rate. With growth temperature $T_{L22}$ being substantially equal to or less than growth temperature $T_{L21}$, the first etch rate can be greater than the second etch rate. Accordingly, the resulting third layer 124C can have vertical thickness $H_{124C}$ greater than width $W_{124C}$. Further, the resulting third layer 124C can exhibit side surfaces with (110) and/or (111) crystal planes. In some embodiments, as shown in FIG. 7A, the epitaxial growth process together with the in-situ etching process can form third layer 124C having a side surface $S_{124C}$ substantially perpendicular to substrate 102, because the epitaxial growth process together with the etching process has a lower growth rate and a higher etching rate over the (110) crystal plane. In some embodiments, side surface $S_{124C}$ can include a (110) crystal plane. In some embodiments, the epitaxial growth process together with the in-situ etching process can form third layer 124C having a side surface $U_{124C}$ proximate to first layer 124A's top surface $T_{124A}$, where side surface $U_{124C}$ can include a (111) crystal plane, because the epitaxial growth process together with the in-situ etching process has a lower growth rate and a higher etching rate over the (111) crystal plane. In some embodiments, the epitaxial growth process together with the in-situ etching process can form third layer 124C having a top surface $T_{124C}$ that can include (111) crystal planes (shown in FIG. 7A) along the y-direction. In some embodiments, top surface $T_{124C}$ can be above or substantially coplanar with fin structure 108's first top surface 108$_T$. In some embodiments, as shown in FIG. 7B, the in-situ etching process can etch a portion of the grown third layer 124C to expose fin structure 108's first top surface 108$_T$. In some embodiments, the in-situ etching process can etch a portion of the grown third layer 124C to expose the underlying second layer 124B and/or first layer 124A (shown in FIG. 7B). In some embodiments, the in-situ etching process can etch a portion of the grown third layer 124C to separate third layer 124C from gate spacer 104 (e.g., separation S$_{124C}$ greater than zero, as shown in FIG. 7B).

Referring to FIG. 2, in operation 225, a fourth epitaxial region is formed over the third epitaxial region. For example, capping layer 124D (shown in FIGS. 8A and 8B) can be formed over third layer 124C of FIGS. 7A and 7B with reference to FIGS. 8A, 8B, and 9. The process of forming capping layer 124D can include epitaxially growing a semiconductor material over third layer 124C using an epitaxial growth process with a growth temperature T$_{L3}$ (shown in FIG. 9). Growth temperature T$_{L3}$ can be any suitable temperature greater than growth temperatures T$_{L21}$ and T$_{L22}$. In some embodiments, growth temperature T$_{L3}$ can be greater than growth temperature T$_{L1}$. The epitaxial growth process for capping layer 124D can result in capping layer 124D with a width W$_{124D}$ and a vertical thickness H$_{124D}$. In some embodiments, vertical thickness H$_{124D}$ can be greater than or substantially equal to width W$_{124D}$. In some embodiments, capping layer 124D's width W$_{124D}$ and thickness H$_{124D}$ can be substantially equal to capping layer 124D's width and thickness of the resulting S/D region 124 (shown in FIGS. 1B and 1C) after method 200. In some embodiments, the combination (e.g., W$_{124B}$+2×W$_{124C}$+2×W$_{124D}$) of second layer 124B's width W$_{124B}$, twice of third layer 124C's width W$_{124C}$, and twice of capping layer 124D's width W$_{124D}$ can be substantially equal to S/D region 124's width W$_{124}$ shown in FIG. 1B. In some embodiments, the combination (e.g., H$_{124A}$+H$_{124B}$+H$_{124C}$+H$_{124D}$) of first layer 124A's thickness H$_{124A}$, second layer 124B's thickness H$_{124B}$, third layer 124C's thickness H$_{124C}$, and capping layer 124D's thickness H$_{124D}$ can be substantially equal to S/D region 124's height H$_{124}$ shown in FIG. 1B. The epitaxial growth process for capping layer 124D can include a CVD process, an LPCVD process, a RTCVD process, an MOCVD process, an ALCVD process, an UHVCVD process, a RPCVD process, an MBE process, a CDE process, or an SEG process. The epitaxial growth process for capping layer 124D can be performed using lower-order precursors or higher-order precursors. The epitaxial growth process for capping layer 124D can further include doping the grown semiconductor material with p-type dopants or n-type dopants. For example, the epitaxial growth process can be performed using suitable dopant precursors, such as B$_2$H$_6$, BF$_2$, and BF$_3$, to dope boron (e.g., a p-type dopant) in capping layer 124D with a suitable doping concentration.

The epitaxial growth process for capping layer 124D can further include an in-situ etching process to etch a portion of the grown semiconductor material by using an etching gas, such as HCl and SiH$_4$. The in-situ etching process can etch (110)/(111) crystal planes with a first etch rate, and the etching process can further etch (100) crystal planes with a second etch rate lower than the first etch rate. In some embodiments, as shown in FIG. 8A, the epitaxial growth process together with the in-situ etching process can form capping layer 124D having a side surface S$_{124D}$ substantially perpendicular to substrate 102, because the epitaxial growth process together with the etching process has a higher etching rate over the (110) crystal plane. In some embodiments, side surface S$_{124D}$ can include a (110) crystal plane. In some embodiments, the epitaxial growth process together with the in-situ etching process can expose third layer 124C's side surface U$_{124}$c, because the epitaxial growth process together with the etching process has a negligible growth rate and a higher etching rate over the (111) crystal plane. In some embodiments, the epitaxial growth process together with the in-situ etching process can form capping layer 124D having a top surface T$_{124D}$ that can include (111) crystal planes (shown in FIG. 8A) along the y-direction. In some embodiments, top surface T$_{124D}$ can be above or substantially coplanar with fin structure 108's first top surface 108$_T$. In some embodiments, the epitaxial growth process together with the in-situ etching process can form capping layer 124D in contact with the underlying second layer 124B and/or first layer 124A (shown in FIG. 8B). In some embodiments, as shown in FIG. 8B, the in-situ etching process can etch a portion of the grown capping layer 124D to expose fin structure 108's first top surface 108$_T$.

Referring to FIG. 2, in operation 230, the sacrificial gate structure is replaced with a metal gate structure. For example, sacrificial gate structure 310 can be replaced with gate structure 110 with reference to FIGS. 10A and 10B. The process of forming gate structure 110 can include (i) forming ILD layer 130 over third layer 124C and capping layer 124D using a suitable deposition process, such as a PVD process and a CVD process; (ii) removing hard mask layer 350 to coplanarize polysilicon layer 348 with ILD layer 130 using a polishing process, such as a CMP process; (iii) removing polysilicon layer 348 to form a recess (not shown in FIGS. 10A and 10B) to expose fin structures 108 using an etching process; and (iv) filling gate dielectric layer 112 and a gate electrode 114 in the recess using a suitable deposition process, such as an ALD process, a CVD process, and a PVD process. Based on the disclosure herein, other processes for forming gate structure 110 are within the spirit and scope of this disclosure.

Figure 12:
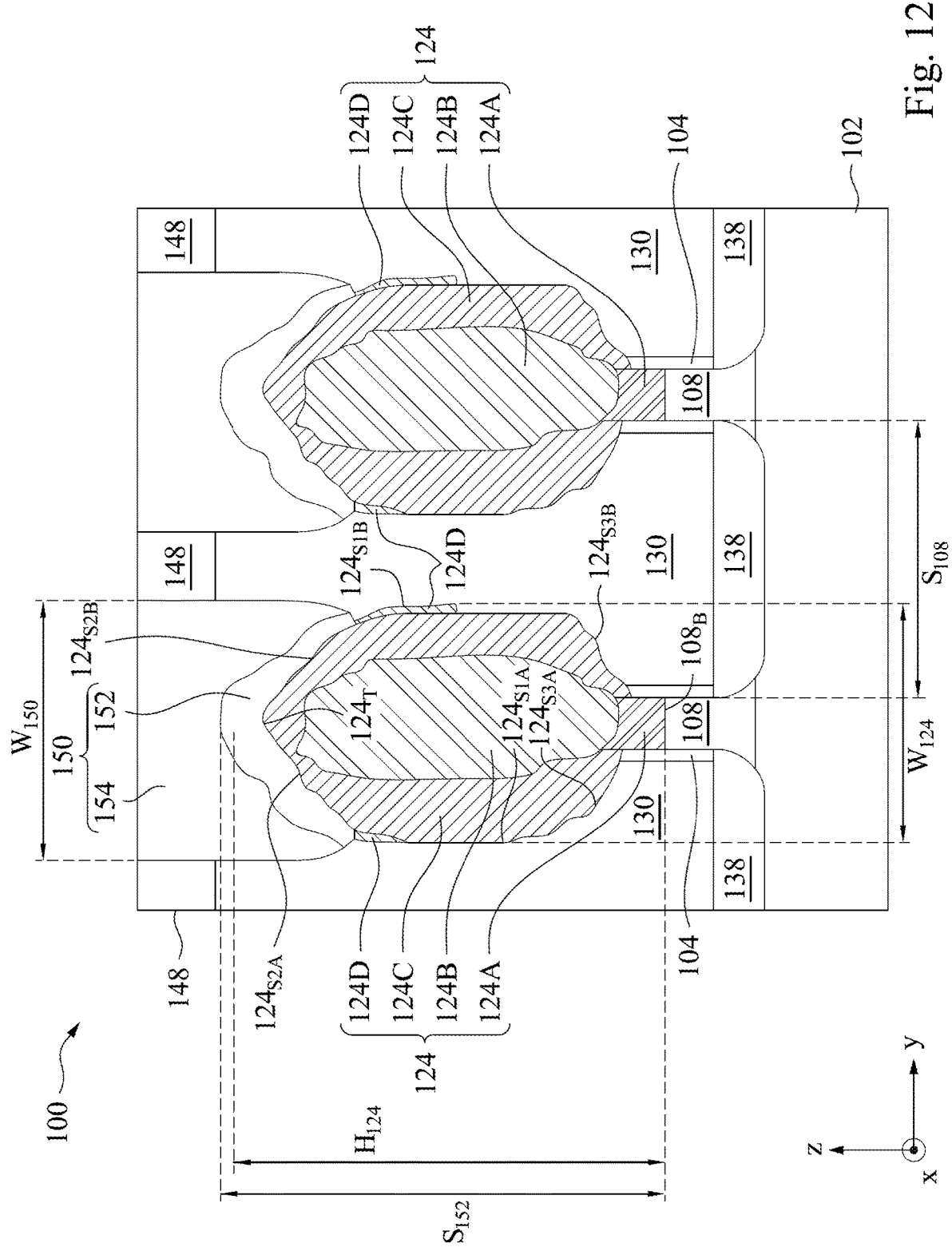

Operation 230 can further include forming a S/D contact adjacent to the metal gate structure. For example, trench conductor structure 150 (shown in FIGS. 1A-1C and 12) can be formed adjacent to gate structure 110 with reference to FIGS. 11A and 11B. The process of forming trench conductor structure 150 can include (i) blanket depositing layer of insulating material 148 over the structure of FIGS. 10A and 10B (e.g., over gate structure 110 and over S/D region 124) via a suitable deposition process, such as a CVD process, a PVD process, and an ALD process; (ii) forming a recess structure 1161 with width W$_{150}$ (shown in FIGS. 11A and 11B) through layer of insulating material 148 and ILD layer 130 to expose the underlying S/D region 124 using a lithography process and an etching process; (iii) forming silicide layer 152 (shown in FIGS. 1B and 1C) in recess structure 1161 and forming layer of conductive material 154 (shown in FIGS. 1B and 1C) over silicide layer 152 using a suitable deposition process (e.g., a CVD process, an ALD process, a PVD process, and an e-beam evaporation process) and a polishing process (e.g., a CMP process). In some embodiments, recess structure 1161 can expose S/D region 124's top surface 124$_T$. In some embodiments, recess structure 1161 can expose S/D region 124's side surfaces 124$_{S1A}$, 124$_{S1B}$, 124$_{S2A}$, and/or 124$_{S2B}$. In some embodiments, with S/D region 124's width W$_{124}$ being reduced by operations 210-225, S/D region 124's volume loss (e.g., RSD loss) caused by the etching process for forming recess structure 1161 can be avoided or reduced. In some embodiments, the process of forming silicide layer 152 can include (i) depositing a layer of metallic material, such as titanium, cobalt, nickel, tungsten, and any other suitable metallic material over recess structure 116I to contact S/D region 124; (ii) performing an annealing process to react a portion of the deposited layer of metallic material with S/D region 124 (e.g., reacting with capping layer 124D, reacting with third layer 124C, and/or reacting with second layer 124B); and (iii) removing an un-reacted portion of the deposited layer of metallic material using an etching process. In some embodiments, the annealing process of forming silicide layer 152 can include reacting the deposited layer of metallic material with portions capping layer 124D proximate to S/D region 124's top surface $124_T$. Accordingly, as shown in FIG. 12 (e.g., FIG. 12 can be an embodiment of semiconductor device 100 after method 200), the resulting trench conductor structure 150 (e.g., silicide layer 152) can contact third layer 124C and portions of capping layer 124D proximate to S/D region 124's side surfaces $124_{S1A}$ and/or $124_{S1B}$.

The present disclosures provides an exemplary transistor S/D structure and a method for forming the same. The S/D structure can have a reduced lateral extension to avoid RSD loss and RSD merging. The S/D structure can further have an enhanced vertical extension to maintain a sufficient volume to provide sufficient stress to the transistor channel. The method of forming the S/D structure can include epitaxially growing the S/D structure using an epitaxial growth process with a reduced growth temperature. With the reduced growth temperature, the epitaxial growth process can have a growth rate greater along the vertical direction than along the lateral direction. Further, with the reduced growth temperature, the resulting S/D structure can reduce an unintentional dopant diffusion into the transistor channel. Further, with the reduced growth temperature, the resulting S/D structure can enhance an active doping concentration of the S/D structure, as the reduced growth temperature can reduce the growth rate to increase the efficiency for the dopants being incorporated in the S/D region's lattice structure. Accordingly, a benefit of the transistor S/D structure, among others, is to reduce the transistor contact resistance and avoid electrical shorting between transistors, thus improving the IC's performance and yield.

In some embodiments, a semiconductor structure can include a substrate, a gate structure over the substrate, and a source/drain (S/D) region adjacent to the gate structure. The S/D region can include first and second side surfaces separated from each other. The S/D region can further include top and bottom surfaces between the first and second side surfaces. A first separation between the top and bottom surfaces can be greater than a second separation between the first and second side surfaces.

In some embodiments, a semiconductor structure can include a substrate, a fin structure over the substrate, a gate structure over the fin structure, and a source/drain (S/D) region formed in the fin structure and adjacent to the gate structure. The S/D region can include a first epitaxial layer extending from a first top surface of the fin structure towards the fin structure, wherein the first epitaxial layer can be doped with a first doping concentration. The S/D region can further include a second epitaxial layer over the first epitaxial layer. The second epitaxial layer can be doped with a second doping concentration greater than the first doping concentration. A first separation between a second top surface of the second epitaxial layer and a bottom surface of the first epitaxial layer can be greater than a second separation between first and second side surfaces of the second epitaxial layer.

In some embodiments, a method can include forming a fin structure over a substrate, forming a gate structure over the fin structure, forming a recess structure in the fin structure and adjacent to the gate structure, forming a first epitaxial layer in the recess structure, and forming a second epitaxial layer with a height and a width over the first epitaxial layer. The process of forming the first epitaxial layer can include doping the first epitaxial layer with a first doping concentration. The process of forming the second epitaxial layer can include doping the second epitaxial layer with a second doping concentration greater than the first concentration. The process of forming the second epitaxial layer can further include forming the second epitaxial layer with the height greater than the width.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a fin structure over a substrate;
   forming a recess structure in the fin structure; and
   forming a source/drain (S/D) region on the fin structure, comprising:
      forming, at a first temperature, a first epitaxial layer in the recess structure; and
      forming, after forming the first epitaxial layer and at a second temperature different from the first temperature, a second epitaxial layer over the first epitaxial layer, wherein forming the second epitaxial layer comprises etching the second epitaxial layer while epitaxially growing the second epitaxial layer.

2. The method of claim 1, wherein the second temperature is lower than the first temperature by about 100° C. to about 400° C.

3. The method of claim 1, wherein the second temperature is between about 250° C. to about 500° C.

4. The method of claim 1, wherein forming the S/D region further comprises forming a third epitaxial layer over the second epitaxial layer at a third temperature equal to or less than the second temperature.

5. The method of claim 1, wherein forming the second epitaxial layer comprises epitaxially growing the second epitaxial layer at a first growth rate along a direction substantially parallel to the substrate and a second growth rate along another direction substantially perpendicular to the substrate, wherein the second growth rate is greater than the first growth rate.

6. The method of claim 1, wherein forming the second epitaxial layer comprises epitaxially growing a silicon germanium layer.

7. The method of claim 1, wherein forming the second epitaxial layer comprises epitaxially growing the second epitaxial layer over a (100) crystal plane substantially parallel to the substrate.

8. The method of claim 1, wherein forming the S/D region further comprises increasing a doping concentration away from side surfaces of the S/D region.

9. A semiconductor structure, comprising:
a substrate;
a source/drain (S/D) region on the substrate, wherein a height of the S/D region is greater than a width of the S/D region, and wherein the S/D region comprises:
  upper and lower surfaces that are nonplanar; and
  a layer having a gradient doping concentration increasing along a vertical direction away from the substrate; and
a silicide layer over the S/D region.

10. The semiconductor structure of claim 9, wherein the S/D region further comprises silicon germanium.

11. The semiconductor structure of claim 9, wherein a ratio of the height to the width is greater than about 2.

12. The semiconductor structure of claim 9, further comprising a layer of conductive material over the silicide layer.

13. The semiconductor structure of claim 9, wherein the S/D region further comprises p-type dopants or n-type dopants.

14. The semiconductor structure of claim 9, wherein side surfaces of S/D region comprise (110) and (111) crystal planes.

15. A semiconductor structure, comprising:
a fin structure on a substrate; and
a source/drain (S/D) region over the fin structure, wherein the S/D region comprises:
  a first epitaxial layer in the fin structure; and
  a second epitaxial layer over a top surface of the first epitaxial layer, wherein a height of the second epitaxial layer is greater than a width of the second epitaxial layer, and wherein an atomic concentration of germanium in the second epitaxial layer gradually increases along a direction away from the first epitaxial layer.

16. The semiconductor structure of claim 15, wherein the first epitaxial layer comprises silicon germanium with an atomic concentration of germanium from about 5% to about 30%.

17. The semiconductor structure of claim 15, wherein the second epitaxial layer comprises silicon germanium with the atomic concentration of germanium from about 30% to about 50%.

18. The semiconductor structure of claim 15, wherein the first epitaxial layer has a doping concentration from about $5 \times 10^{19}/cm^3$ to about $5 \times 10^{20}/cm^3$.

19. The semiconductor structure of claim 15, wherein the second epitaxial layer has a doping concentration from about $5 \times 10^{20}/cm^3$ to about $1 \times 10^{21}/cm^3$.

20. The semiconductor structure of claim 15, wherein the S/D region further comprises a third epitaxial layer over the second epitaxial layer, wherein the third epitaxial layer has an atomic concentration of germanium from about 45% to about 65%.

* * * * *